United States Patent
Li

(10) Patent No.: US 11,144,250 B2
(45) Date of Patent: Oct. 12, 2021

(54) METHOD AND SYSTEM FOR FACILITATING A PERSISTENT MEMORY-CENTRIC SYSTEM

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 7 days.

(21) Appl. No.: 16/818,920

(22) Filed: Mar. 13, 2020

(65) Prior Publication Data

US 2021/0286555 A1    Sep. 16, 2021

(51) Int. Cl.
*G06F 3/06* (2006.01)
*G06F 12/1009* (2016.01)
(Continued)

(52) U.S. Cl.
CPC .......... *G06F 3/0659* (2013.01); *G06F 3/0604* (2013.01); *G06F 3/068* (2013.01);
(Continued)

(58) Field of Classification Search
CPC .... G06F 3/0659; G06F 12/1009; G06F 3/068; G06F 3/0604; G06F 2212/1016;
(Continued)

(56) References Cited

U.S. PATENT DOCUMENTS 4,775,932 A    10/1988 Oxley
5,930,167 A    7/1999 Lee
(Continued)

FOREIGN PATENT DOCUMENTS

JP    2003022209    1/2003
JP    2011175422    9/2011
(Continued)

OTHER PUBLICATIONS

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.
(Continued)

*Primary Examiner* — Fernando Hidalgo
(74) *Attorney, Agent, or Firm* — Shun Yao; Park, Vaughan, Fleming & Dowler LLP

(57) ABSTRACT

A system is provided to receive a first request to write data to a non-volatile storage system, which comprises an MRAM, a NAND, and an HDD. The system allocates a first physical address in the MRAM and writes the data to the MRAM at the MRAM first physical address. In response to determining that the data in the MRAM is not accessed within a first predetermined time period, the system copies the data from the MRAM to the NAND at a NAND physical page address and maps a logical page index associated with the data to the NAND physical page address. In response to determining that the data in the NAND is not accessed within a second predetermined time period, the system copies the data from the NAND to the HDD based on an HDD physical address and maps the NAND physical page address to the HDD physical address.

24 Claims, 13 Drawing Sheets
(2 of 13 Drawing Sheet(s) Filed in Color)

(51) Int. Cl.
   *G11C 11/16* (2006.01)
   *G11C 16/10* (2006.01)
   *G11C 16/16* (2006.01)
   *G11C 11/00* (2006.01)

(52) U.S. Cl.
   CPC ........ *G06F 12/1009* (2013.01); *G11C 11/005* (2013.01); *G11C 11/1659* (2013.01); *G11C 11/1675* (2013.01); *G11C 16/10* (2013.01); *G11C 16/16* (2013.01); *G06F 2212/1016* (2013.01)

(58) Field of Classification Search
   CPC ............. G11C 11/1659; G11C 11/005; G11C 11/1675; G11C 16/16; G11C 16/10
   USPC ........................................................ 711/103
   See application file for complete search history.

(56) References Cited

U.S. PATENT DOCUMENTS

| | | | |
|---|---|---|---|
| 6,148,377 A | 11/2000 | Carter | |
| 6,226,650 B1 | 5/2001 | Mahajan et al. | |
| 6,243,795 B1 | 6/2001 | Yang | |
| 7,529,965 B2* | 5/2009 | Ikeuchi | G06F 11/0727 714/6.2 |
| 7,565,454 B2 | 7/2009 | Zuberi | |
| 7,958,433 B1 | 6/2011 | Yoon | |
| 8,085,569 B2 | 12/2011 | Kim | |
| 8,144,512 B2 | 3/2012 | Huang | |
| 8,166,233 B2 | 4/2012 | Schibilla | |
| 8,260,924 B2 | 9/2012 | Koretz | |
| 8,281,061 B2 | 10/2012 | Radke | |
| 8,452,819 B1 | 5/2013 | Sorenson, III | |
| 8,516,284 B2 | 8/2013 | Chan | |
| 8,751,763 B1 | 6/2014 | Ramarao | |
| 8,825,937 B2 | 9/2014 | Atkisson | |
| 8,949,208 B1 | 2/2015 | Xu | |
| 9,043,545 B2 | 5/2015 | Kimmel | |
| 9,088,300 B1 | 7/2015 | Chen | |
| 9,092,223 B1 | 7/2015 | Pani | |
| 9,208,817 B1* | 12/2015 | Li | G06F 3/0631 |
| 9,280,472 B1 | 3/2016 | Dang | |
| 9,280,487 B2 | 3/2016 | Candelaria | |
| 9,436,595 B1 | 9/2016 | Benitez | |
| 9,529,601 B1 | 12/2016 | Dharmadhikari | |
| 9,588,698 B1 | 3/2017 | Karamcheti | |
| 9,588,977 B1 | 3/2017 | Wang | |
| 10,013,169 B2 | 7/2018 | Fisher | |
| 10,229,735 B1 | 3/2019 | Natarajan | |
| 10,235,198 B2 | 3/2019 | Qiu | |
| 11,023,374 B2* | 6/2021 | Chiu | G06F 12/1009 |
| 2002/0010783 A1 | 1/2002 | Primak | |
| 2002/0073358 A1 | 6/2002 | Atkinson | |
| 2002/0161890 A1 | 10/2002 | Chen | |
| 2003/0074319 A1 | 4/2003 | Jaquette | |
| 2003/0163594 A1 | 8/2003 | Aasheim | |
| 2003/0163633 A1 | 8/2003 | Aasheim | |
| 2003/0217080 A1 | 11/2003 | White | |
| 2004/0010545 A1 | 1/2004 | Pandya | |
| 2004/0103238 A1 | 5/2004 | Avraham | |
| 2004/0143718 A1 | 7/2004 | Chen | |
| 2004/0255171 A1 | 12/2004 | Zimmer | |
| 2004/0268278 A1 | 12/2004 | Hoberman | |
| 2005/0038954 A1 | 2/2005 | Saliba | |
| 2005/0097126 A1 | 5/2005 | Cabrera | |
| 2005/0177755 A1 | 8/2005 | Fung | |
| 2005/0195635 A1 | 9/2005 | Conley | |
| 2005/0235067 A1 | 10/2005 | Creta | |
| 2005/0235171 A1 | 10/2005 | Igari | |
| 2006/0156012 A1 | 7/2006 | Beeson | |
| 2007/0033323 A1 | 2/2007 | Gorobets | |
| 2007/0061502 A1 | 3/2007 | Lasser | |
| 2007/0101096 A1 | 5/2007 | Gorobets | |
| 2007/0283081 A1 | 12/2007 | Lasser | |
| 2007/0285980 A1 | 12/2007 | Shimizu | |
| 2008/0034154 A1 | 2/2008 | Lee | |
| 2008/0112238 A1 | 5/2008 | Kim | |
| 2008/0301532 A1 | 12/2008 | Uchikawa | |
| 2009/0113219 A1 | 4/2009 | Aharonov | |
| 2009/0282275 A1 | 11/2009 | Yermalayeu | |
| 2009/0307249 A1 | 12/2009 | Koifman | |
| 2009/0310412 A1 | 12/2009 | Jang | |
| 2010/0031000 A1 | 2/2010 | Flynn | |
| 2010/0169470 A1 | 7/2010 | Takashige | |
| 2010/0217952 A1 | 8/2010 | Iyer | |
| 2010/0229224 A1 | 9/2010 | Etchegoyen | |
| 2010/0241848 A1 | 9/2010 | Smith | |
| 2010/0321999 A1 | 12/2010 | Yoo | |
| 2010/0325367 A1 | 12/2010 | Kornegay | |
| 2011/0055458 A1 | 3/2011 | Kuehne | |
| 2011/0055471 A1 | 3/2011 | Thatcher | |
| 2011/0072204 A1 | 3/2011 | Chang | |
| 2011/0099418 A1 | 4/2011 | Chen | |
| 2011/0153903 A1 | 6/2011 | Hinkle | |
| 2011/0161784 A1 | 6/2011 | Selinger | |
| 2011/0191525 A1 | 8/2011 | Hsu | |
| 2011/0218969 A1 | 9/2011 | Anglin | |
| 2011/0231598 A1 | 9/2011 | Hatsuda | |
| 2011/0292538 A1 | 12/2011 | Haga | |
| 2011/0299317 A1 | 12/2011 | Shaeffer | |
| 2011/0302353 A1 | 12/2011 | Confalonieri | |
| 2012/0039117 A1 | 2/2012 | Webb | |
| 2012/0084523 A1 | 4/2012 | Littlefield | |
| 2012/0117399 A1 | 5/2012 | Chan | |
| 2012/0147021 A1 | 6/2012 | Cheng | |
| 2012/0159289 A1 | 6/2012 | Piccirillo | |
| 2012/0210095 A1 | 8/2012 | Nellans | |
| 2012/0233523 A1 | 9/2012 | Krishnamoorthy | |
| 2012/0246392 A1 | 9/2012 | Cheon | |
| 2012/0278579 A1 | 11/2012 | Goss | |
| 2012/0284587 A1 | 11/2012 | Yu | |
| 2013/0013880 A1 | 1/2013 | Tashiro | |
| 2013/0061029 A1 | 3/2013 | Huff | |
| 2013/0073798 A1 | 3/2013 | Kang | |
| 2013/0080391 A1 | 3/2013 | Raichstein | |
| 2013/0145085 A1 | 6/2013 | Yu | |
| 2013/0145089 A1 | 6/2013 | Eleftheriou | |
| 2013/0151759 A1 | 6/2013 | Shim | |
| 2013/0159251 A1 | 6/2013 | Skrenta | |
| 2013/0159723 A1 | 6/2013 | Brandt | |
| 2013/0166820 A1 | 6/2013 | Batwara | |
| 2013/0173845 A1 | 7/2013 | Aslam | |
| 2013/0191601 A1 | 7/2013 | Peterson | |
| 2013/0219131 A1 | 8/2013 | Alexandron | |
| 2013/0318283 A1 | 11/2013 | Small | |
| 2013/0318395 A1 | 11/2013 | Kalavade | |
| 2014/0019650 A1 | 1/2014 | Li | |
| 2014/0082273 A1 | 3/2014 | Segev | |
| 2014/0108414 A1 | 4/2014 | Stillerman | |
| 2014/0181532 A1 | 6/2014 | Camp | |
| 2014/0195564 A1 | 7/2014 | Talagala | |
| 2014/0233950 A1 | 8/2014 | Luo | |
| 2014/0250259 A1 | 9/2014 | Ke | |
| 2014/0279927 A1 | 9/2014 | Constantinescu | |
| 2014/0304452 A1 | 10/2014 | De La Iglesia | |
| 2014/0310574 A1 | 10/2014 | Yu | |
| 2014/0359229 A1 | 12/2014 | Cota-Robles | |
| 2014/0365707 A1 | 12/2014 | Talagala | |
| 2015/0019798 A1 | 1/2015 | Huang | |
| 2015/0082317 A1 | 3/2015 | You | |
| 2015/0106556 A1 | 4/2015 | Yu | |
| 2015/0106559 A1 | 4/2015 | Cho | |
| 2015/0142752 A1 | 5/2015 | Chennamsetty | |
| 2015/0227316 A1 | 8/2015 | Warfield | |
| 2015/0277937 A1 | 10/2015 | Swanson | |
| 2015/0301964 A1 | 10/2015 | Brinicombe | |
| 2015/0304108 A1 | 10/2015 | Obukhov | |
| 2015/0363271 A1 | 12/2015 | Haustein | |
| 2015/0372597 A1 | 12/2015 | Luo | |
| 2016/0014039 A1 | 1/2016 | Reddy | |
| 2016/0026575 A1 | 1/2016 | Samanta | |
| 2016/0048341 A1 | 2/2016 | Constantinescu | |
| 2016/0098344 A1 | 4/2016 | Gorobets | |

(56) References Cited

U.S. PATENT DOCUMENTS

| | | |
|---|---|---|
| 2016/0110254 A1 | 4/2016 | Cronie |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0109232 A1 | 4/2017 | Cha |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0212708 A1 | 7/2017 | Suhas |
| 2017/0228157 A1 | 8/2017 | Yang |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0088867 A1 | 3/2018 | Kaminaga |
| 2018/0107591 A1 | 4/2018 | Smith |
| 2018/0143780 A1 | 5/2018 | Cho |
| 2018/0150640 A1 | 5/2018 | Li |
| 2018/0167268 A1 | 6/2018 | Liguori |
| 2018/0189182 A1 | 7/2018 | Wang |
| 2018/0212951 A1 | 7/2018 | Goodrum |
| 2018/0270110 A1 | 9/2018 | Chugtu |
| 2018/0293014 A1 | 10/2018 | Ravimohan |
| 2018/0329776 A1 | 11/2018 | Lai |
| 2018/0349396 A1 | 12/2018 | Blagojevic |
| 2018/0356992 A1 | 12/2018 | Lamberts |
| 2018/0373428 A1 | 12/2018 | Kan |
| 2019/0012111 A1* | 1/2019 | Li ................. G06F 3/0656 |
| 2019/0073262 A1 | 3/2019 | Chen |
| 2019/0205206 A1 | 7/2019 | Hornung |
| 2020/0151110 A1* | 5/2020 | Haswell ........ G06F 12/0246 |

FOREIGN PATENT DOCUMENTS

| | | |
|---|---|---|
| WO | 9418634 | 8/1994 |
| WO | 1994018634 | 8/1994 |

OTHER PUBLICATIONS

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

* cited by examiner

METHOD AND SYSTEM FOR FACILITATING A PERSISTENT MEMORY-CENTRIC SYSTEM

BACKGROUND

Field

This disclosure is generally related to the field of data storage. More specifically, this disclosure is related to a method and system for facilitating a persistent memory-centric system.

Related Art

Today, various storage systems are being used to store and access the ever-increasing amount of digital content. A storage system can include storage servers with one or more storage devices or drives, and a storage device or drive can include storage media with persistent memory, i.e., a non-volatile memory. One fast-developing type of non-volatile memory is magnetoresistive random access memory (MRAM). MRAM can generally provide a low-latency access similar to the low-latency access of static random access memory (SRAM). The continuing development and manufacturing of MRAM can result in improvements in both capacity and density. However, the overall cost of MRAM continues to remain higher than the overall cost of dynamic random access memory (DRAM).

Current applications require high-performance processing, which requires low-latency access, data persistency, high endurance, and power efficiency. The high-performance processing can involve moving large amounts of data between processors, memory, and storage drives, which can result in significant challenges in performance, cost, power consumption, etc.

One current storage system is based on a memory-storage hierarchy, and includes additional tiers such as 3D XPoint (3DXP) dual in-line memory modules (DIMMs) and Optane solid state drives (SSDs). However, this system is constrained by several factors: increased data copy operations can lead to increased write amplification and power consumption; the access latency of the additional tiers of 3DXP DIMMs and Optane SSDs can be greater than that of DRAM, and the throughput of these additional tiers can be lower than that of DRAM DIMM; the endurance of 3DXP is lower than that of DRAM DIMM; currently, 3DXP DIMM can only be used as either volatile memory or non-volatile storage, resulting in issues with either data persistency or memory access format; and the separation of memory from storage involves a certain overhead from the file system.

Thus, the conventional memory-storage hierarchy and the described current storage system may be limited in providing the low latency, data persistency/retention, high endurance, and power efficiency required by the high-performance processing of current applications. In addition, the conventional storage systems are constrained in providing optimal usage and massive deployment of the fast-developing non-volatile memory of MRAM.

SUMMARY

One embodiment provides a system which facilitates operation of a storage system. During operation, the system receives a first request to write data to a non-volatile storage system, which comprises a first non-volatile memory associated with a latency which is less than a first predetermined threshold, a Not-AND (NAND) memory, and a second non-volatile memory which associated with a latency which is greater than a second predetermined threshold. The system allocates a first physical address in the first non-volatile memory, writes the data to the first non-volatile memory based on the first non-volatile memory first physical address, and maps a logical page index associated with the data to the first non-volatile memory first physical address. In response to determining that the data in the first non-volatile memory is not accessed within a first predetermined time period, the system copies the data from the first non-volatile memory to the NAND based on a physical page address in the NAND and maps the logical page index to the NAND physical page address.

In some embodiments, the first non-volatile memory comprises a magnetoresistive random-access memory (MRAM) or a resistive random-access memory (ReRAM), and the second non-volatile memory comprises a hard disk drive (HDD) or magnetic tapes.

In some embodiments, in response to determining that the data in the NAND is not accessed within a second predetermined time period, the system copies the data from the NAND to the HDD based on a physical address in the HDD and maps the NAND physical page address to the HDD physical address.

In some embodiments, in response to determining that the data in the MRAM is accessed within the first predetermined time period, the system classifies the data based on an access frequency as hot data and keeps the data in the MRAM. In response to determining that the data in the NAND is accessed within the second predetermined time period, the system classifies the data based on an access frequency as hot data and keeps the data in the NAND.

In some embodiments, the storage system further comprises a Not-OR (NOR) memory. The logical page index is mapped to the MRAM first physical address in a first entry of a first mapping table in the MRAM, the logical page index is mapped to the NAND physical page address in a second entry of a second mapping table in the NOR, and the NAND physical page address is mapped to the HDD physical address in a third entry of a third mapping table in the NAND.

In some embodiments, in response to determining that the data in the MRAM is not accessed within the first predetermined time period, the system classifies the data based on an access frequency as cold data and invalidates the first entry of the first mapping table in the MRAM.

In some embodiments, the system receives a second request to write an update of the data previously written to the non-volatile storage system. The system allocates a second physical address in the MRAM and writes the updated data to the MRAM based on the MRAM second physical address. The system updates, in the first entry of the first mapping table in the MRAM, the mapping of the logical page index to the MRAM second physical address and invalidates the second entry of the second mapping table in the NOR. The system marks as invalid the data stored at the NAND physical page address.

In some embodiments, the system determines, based on the first mapping table, that the updated data of the second request corresponds to data previously written to the MRAM. The system determines, based on the second mapping table, that the data previously written to the MRAM has been copied to the NAND. The allocated second physical address in the MRAM is the same as the allocated first physical address in the MRAM, and writing the updated data to the MRAM based on the MRAM second physical address causes an in-place overwrite at the MRAM first physical address.

In some embodiments, the system identifies valid pages in the NAND and evaluates the valid pages in the NAND based on a frequency of access by determining a classification for each respective valid page in the NAND.

In some embodiments, in response to determining that the data in a respective valid page in the NAND is not accessed within the second predetermined time period, the system performs the following operations. The system classifies the data based on an access frequency as cold data. The system determines a new physical address in the HDD to which to copy the data, and copies the cold data from the NAND to the HDD based on the HDD new physical address. The system maps, in a fourth entry of the third mapping table, a respective physical page address of the respective valid NAND page to the HDD new physical address. The system invalidates, in the second mapping table in the NOR, an entry corresponding to the respective valid page in the NAND, and marks as invalid the data stored at the respective physical page address.

In some embodiments, the system detects a condition which triggers a garbage collection operation. The system identifies a first NAND block to be recycled, copies valid pages from the first NAND block to an available NAND block, and erases the first NAND block.

In some embodiments, the system loads an operating system (OS) image from the NOR, and launches a plurality of applications based on the non-volatile storage system. The first physical address in the MRAM is allocated by a memory management unit associated with the non-volatile storage system. The memory management unit is configured to execute read/write requests by operating a cumulative physical space associated which the non-volatile storage system without requiring any logical storage drives or DRAM and without visibility into the NAND or the HDD. The cumulative physical space does not include any over-provisioned space associated with the MRAM, the NAND, or the HDD.

BRIEF DESCRIPTION OF THE FIGURES

The patent or application file contains at least one drawing executed in color. Copies of this patent or patent application publication with color drawing(s) will be provided by the Office upon request and payment of the necessary fee.

In the figures, like reference numerals refer to the same figure elements.

DETAILED DESCRIPTION

Figure 1:
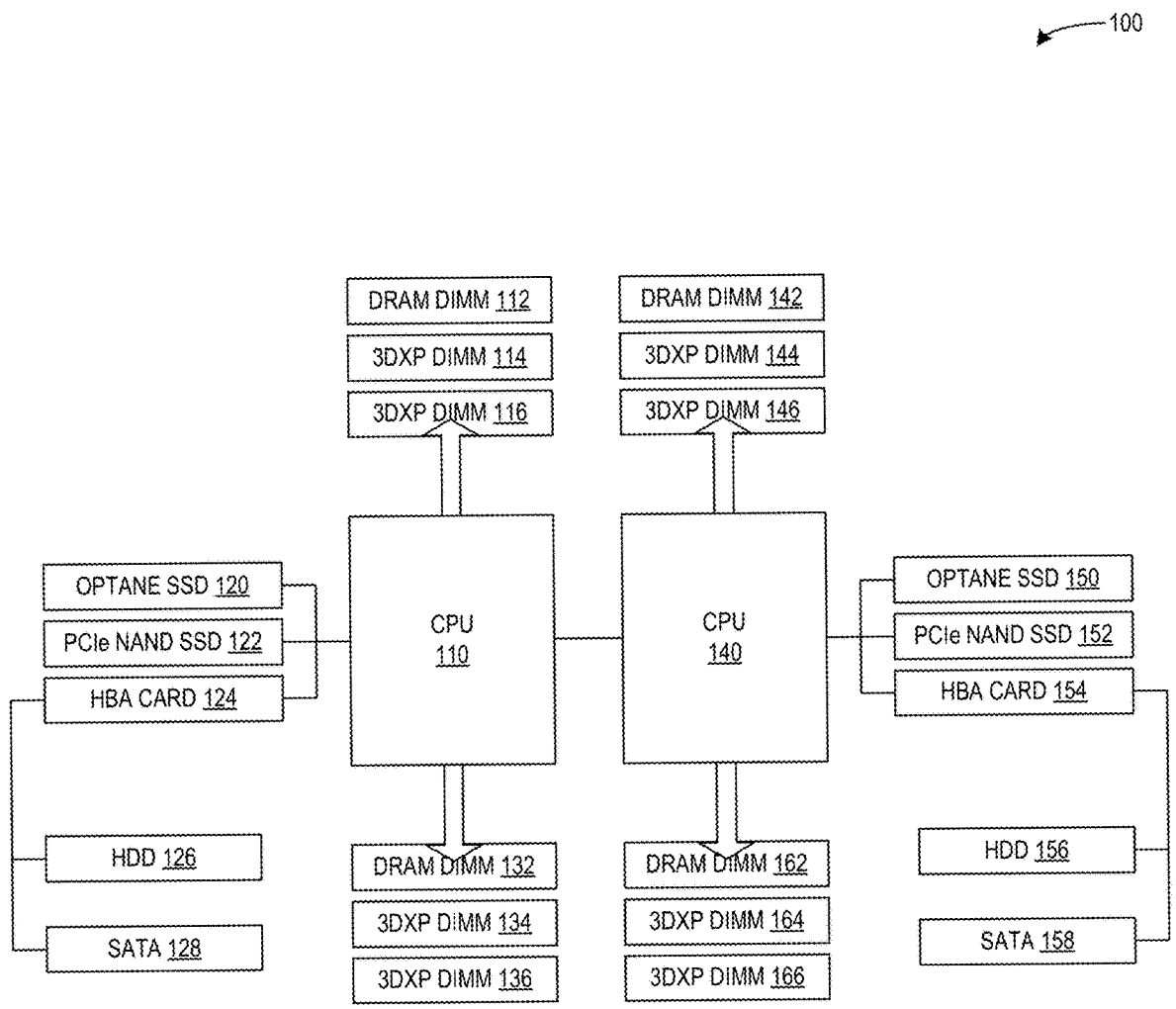
FIG. 1 illustrates an exemplary environment which facilitates operation of a storage system, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.
Overview The embodiments described herein facilitate a non-volatile memory-centric storage system which uses MRAM, NOR, NAND, and HDD to replace the volatile DRAM and logical storage drives of the conventional storage systems to achieve a saving in power and an improvement in efficiency. The cumulative memory space of the various non-volatile storage media can provide a logical memory space which uses MRAM as the host main memory to provide the low-latency access (similar to SRAM), and thus eliminates the need to use the conventional DRAM DIMM. Furthermore, the system can circumvent the conventional tiered hierarchy of the storage stack (e.g., file system, block layer, page cache, etc.), and thus eliminates the need to manage logical drives as in the conventional storage system.

As described above, one type of fast-developing non-volatile memory is MRAM, which can generally provide a low-latency access similar to the low-latency access of static random access memory (SRAM). The continuing development and manufacturing of MRAM can result in improvements in both capacity and density. However, the overall cost of MRAM continues to remain higher than the overall cost of dynamic random access memory (DRAM).

Current applications require high-performance processing, which requires low-latency access, data persistency, high endurance, and power efficiency. The high-performance processing can involve moving large amounts of data between processors, memory, and storage drives, which can result in significant challenges in performance, cost, power consumption, etc.

One current storage system is based on a memory-storage hierarchy, and includes additional tiers such as 3D XPoint (3DXP) dual in-line memory modules (DIMMs) and Optane solid state drives (SSDs). However, this system is constrained by several factors, as described below in relation to FIG. 1. Thus, the conventional memory-storage hierarchy may be limited in providing optimal usage and massive deployment of the fast-developing non-volatile memory of MRAM.

The embodiments described herein address these issues by providing a non-volatile storage system, which includes MRAM, a NOR memory, a NAND memory, and an HDD. A storage server in this non-volatile storage system can use MRAM instead of DRAM DIMM as the main host memory. Because MRAM has a lower latency than DRAM, MRAM can accommodate read/write operations without the constraints discussed in relation to the prior art storage system of FIG. 1. Furthermore, the described non-volatile storage system is based on a storage hierarchy, in which: the MRAM serves as the main memory to accommodate the read/write operations; the NOR flash serves as a low-latency read (and can store a NAND mapping table); the NAND flash serves as the shadow memory for data reliability and can provide extra memory space for the MRAM via page swapping (and can also store an HDD mapping table); and the HDD (or other archive drive) stores cold data that is identified during an evaluation or classification of data based on access frequency or predetermined time periods. An exemplary storage hierarchy is described below in relation to FIG. 2B.

A central processing unit (CPU) or CPU cores need only communicate with the NOR and the MRAM, while data can be moved in a manner transparent to the CPU between the MRAM, the NAND, and the HDD, e.g., based on a "hotness" classification of data. An exemplary internal organization of the available logical memory space and the actual physical media space is described below in relation to FIG. 3, while an exemplary environment and communications for constructing metadata and managing data are described below in relation to FIGS. 5 and 6. The system can also use the NAND memory to mitigate the issue of data retention in the MRAM, as described below in relation to FIGS. 4A and 4B.

Thus, the embodiments of the described non-volatile storage system can provide an accumulated logical memory space based on the multiple storage media of the MRAM, NOR, NAND, and the HDD. By organizing data based on hotness into the described storage hierarchy, and by constructing and maintaining metadata across the different storage media, the described embodiments can result in an improved non-volatile storage system which can efficiently optimize the growing usage of MRAM. The described embodiments thus provide a collaboration between the high-performance media (e.g., MRAM) and the low-cost media (e.g., NAND and HDD).

A "distributed storage system" or a "storage system" can include multiple storage servers. A "non-volatile storage system" can include non-volatile memory. A "storage server" or a "storage system" can refer to a computing device which can include multiple storage devices or storage drives. A "storage device" or a "storage drive" refers to a device or a drive with a non-volatile memory which can provide persistent storage of data, e.g., a solid state drive (SSD), a hard disk drive (HDD), an MRAM-based storage device, or a flash-based storage device. A storage system can also be a computer system.

"Non-volatile memory" refers to storage media which may be used for persistent storage of data, e.g., MRAM, NOR, NAND, HDD, SSD, etc. A "non-volatile storage system" refers to a storage system which includes at least one type of non-volatile memory or physical media which can persistently store data. In the embodiments described herein, the non-volatile storage system includes at least MRAM, NOR, NAND, and HDD. In some embodiments, the non-volatile storage system is described as including a first non-volatile memory associated with a latency which is less than a first predetermined threshold, and also including a second non-volatile memory associated with a latency which is greater than a second predetermined threshold. The described embodiments and figures refer to MRAM as the first non-volatile memory for illustrative purposes only. Other types of the "first non-volatile memory" may be used, e.g. resistive random-access memory (ReRAM) and other similar media with a low latency or a latency which is less than the first predetermined threshold. Furthermore, the described embodiments and figures refer to HDD as the second non-volatile memory for illustrative purposes only. Other types of the "second non-volatile memory" may be used, e.g., magnetic tapes and other similar media with a high latency or a latency which is greater than the second predetermined threshold.

A "computing device" refers to any server, device, node, entity, drive, or any other entity which can provide any computing capabilities.

A "memory management unit" refers to a module, component, or unit associated with the described storage system which can be configured to perform the operations, functions, and methods described herein.

Exemplary Operation of a Storage System in the Prior Art

As described above, conventional storage systems can include tiered storage systems, where additional tiers such as 3DXP DIMM and Optane SSD are inserted to form an even more complicated storage hierarchy. FIG. 1 illustrates an exemplary environment 100 which facilitates operation of a storage system, in accordance with the prior art. Environment 100 can include a pair of central processing units (CPUs) 110 and 140, where each CPU communicates with various DIMM modules and various storage devices. For example, CPU 110 can communicate with or be coupled to: DRAM DIMM 112 and 3DXP DIMMs 114 and 116; DRAM DIMM 132 and 3DXP DIMMs 134 and 136; different types of storage devices, including an Optane SSD 120 and a Peripheral Component Interconnect Express (PCIe) NAND SSD 122; and a host bus adaptor (HBA) card 124, which can communicate with or be coupled to at least an HDD 126 and a Serial Advanced Technology Attachment (SATA) 128. Similarly, CPU 140 can communicate with or be coupled to: DRAM DIMM 142 and 3DXP DIMMs 144 and 146; DRAM DIMM 162 and 3DXP DIMMs 164 and 166; different types of storage devices, including an Optane SSD 150 and a PCIe NAND SSD 152; and an HBA card 154, which can communicate with or be coupled to at least an HDD 156 and a SATA 158.

However, the storage hierarchy depicted in environment 100 may be limited by the following factors. First, because of the additional storage devices, the depicted system may experience an increase in the number of data copy operations. The increase in the number of data copy operations can in turn lead to an increase in both write amplification and power consumption. Second, these additional storage devices (i.e., 3DXP DIMM and Optane SSD) are generally based on phase change memory (PCM). PCM generally has a higher or longer access latency than DRAM, and a lower throughput than DRAM DIMM. Thus, 3DXP DIMM generally cannot increase the overall efficiency of the conventional storage system, and instead may serve only as a complementary component.

Third, the endurance of 3DXP DIMM is lower than that of DRAM DIMM. That is, 3DXP DIMM cannot reach the same endurance or wear level as DRAM DIMM, which can result in the storage media wearing out during usage and before an optimal or efficient time.

Fourth, 3DXP DIMM can currently only be used as either volatile memory or non-volatile storage, resulting in issues with either data persistency or memory access format. That is, when 3DXP is used in the memory mode (e.g., as volatile memory), the data persistency may suffer, and when 3DXP is used in the storage mode (e.g., as non-volatile memory), certain functions like data loading and flushing are required, which does not allow the memory access format to be supported.

Fifth, the conventional storage system and hierarchy of FIG. 1 maintains the separation of memory and storage, which can involve a certain overhead from the file system.

Thus, the conventional memory-storage hierarchy and the described current storage system may be limited in providing the low latency, data persistency/retention, high endurance, and power efficiency required by the high-performance processing of current applications. In addition, the conventional storage systems are constrained in providing optimal usage and massive deployment of the fast-developing non-volatile memory of MRAM. All of these constraints can limit the flexibility and performance of the overall storage system.

Exemplary Storage Hierarchy: Prior Art v. One Embodiment

Figure 2:
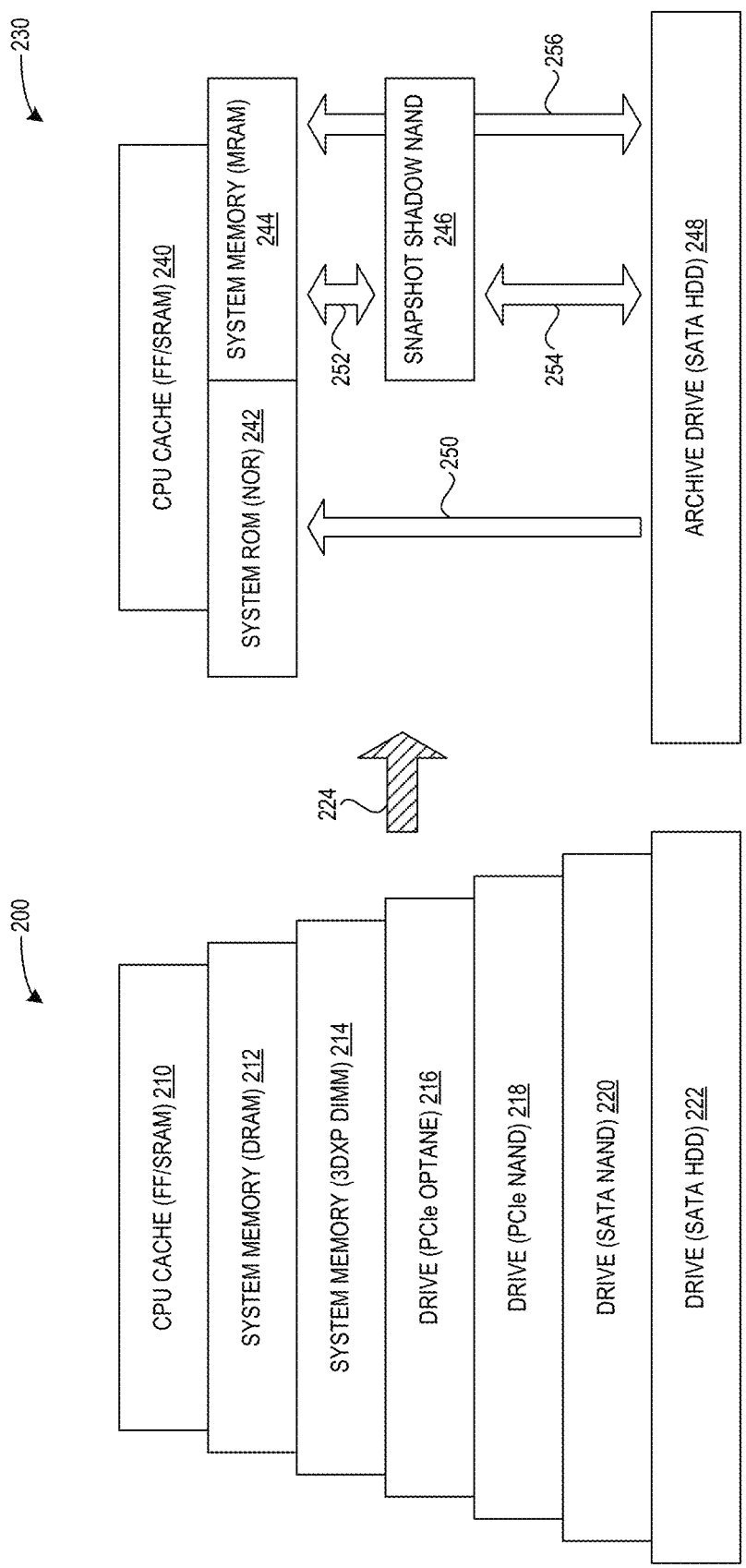
FIG. 2A illustrates an exemplary storage hierarchy, in accordance with the prior art.
FIG. 2B illustrates an exemplary storage hierarchy, in accordance with an embodiment of the present application.

FIG. 2A illustrates an exemplary storage hierarchy 200, in accordance with the prior art. Hierarchy 200 can correspond to the prior art environment 100 of FIG. 1. Hierarchy 200 can include: a CPU cache (flip-flop/static RAM (FF/SRAM)) 210; a system memory (DRAM) 212; a system memory (3DXP DIMM) 214; a storage drive (PCIe Optane) 216; a storage drive (PCIe NAND) 218; a storage drive (SATA NAND) 220; and a storage drive (SATA HDD) 222.

In contrast, FIG. 2B illustrates an exemplary storage hierarchy 230, in accordance with an embodiment of the present application. Hierarchy 230 can include: a CPU cache (FF/SRAM) 240; a system ROM (NOR) 242; a system memory (MRAM) 244; a snapshot shadow NAND 246; and an archive drive (SATA HDD) 248.

MRAM 244 can serve as the main memory to accommodate the read/write operations, while NOR 242 can serve as a memory which provides a low latency for read operations. This allows CPU 240 to communicate directly with NOR 242 and MRAM 244, while NOR 242 and MRAM 244 can load the high-frequency read data from archive drive 248 (via communications 250 and 256). CPU 240 can thus read data from NOR 242 and MRAM 244 to perform any needed data processing or computations, and CPU 240 can write the results of the processing or computation to MRAM 244. Data can be moved between MRAM 244 and NAND 246 (via a communication 252) (e.g., "page swapping") without visibility to CPU 240. That is, the data movement between MRAM 244 and NAND 246 can be transparent to CPU 240. Similarly, data can be moved between NAND 246 and archive drive 248 (via a communication 254) without visibility to CPU 240, i.e., data movement between NAND 246 and archive drive 248 can be transparent to CPU 240. In some embodiments, data can also be moved between MRAM 244 and archive drive 248 (via a communication 256), e.g., when data in MRAM 244 is associated with an access frequency below a certain predetermined threshold or within a predetermined time period.

Thus, storage hierarchy 230 depicts how the cumulative memory of the multiple storage media (i.e., NOR 242, MRAM 244, NAND 246, and HDD 248) can collaborate in a non-volatile storage system to provide a feasible path for massive deployment of MRAM, and can also result in an improvement in the efficiency and performance of the overall storage system. The specific organization and movement of data using hierarchy 230 is described herein, and includes the construction and management of metadata involved in the storage and movement of data between the various storage media of the non-volatile storage system.

Exemplary Organization of a Non-Volatile Storage System

Figure 3:
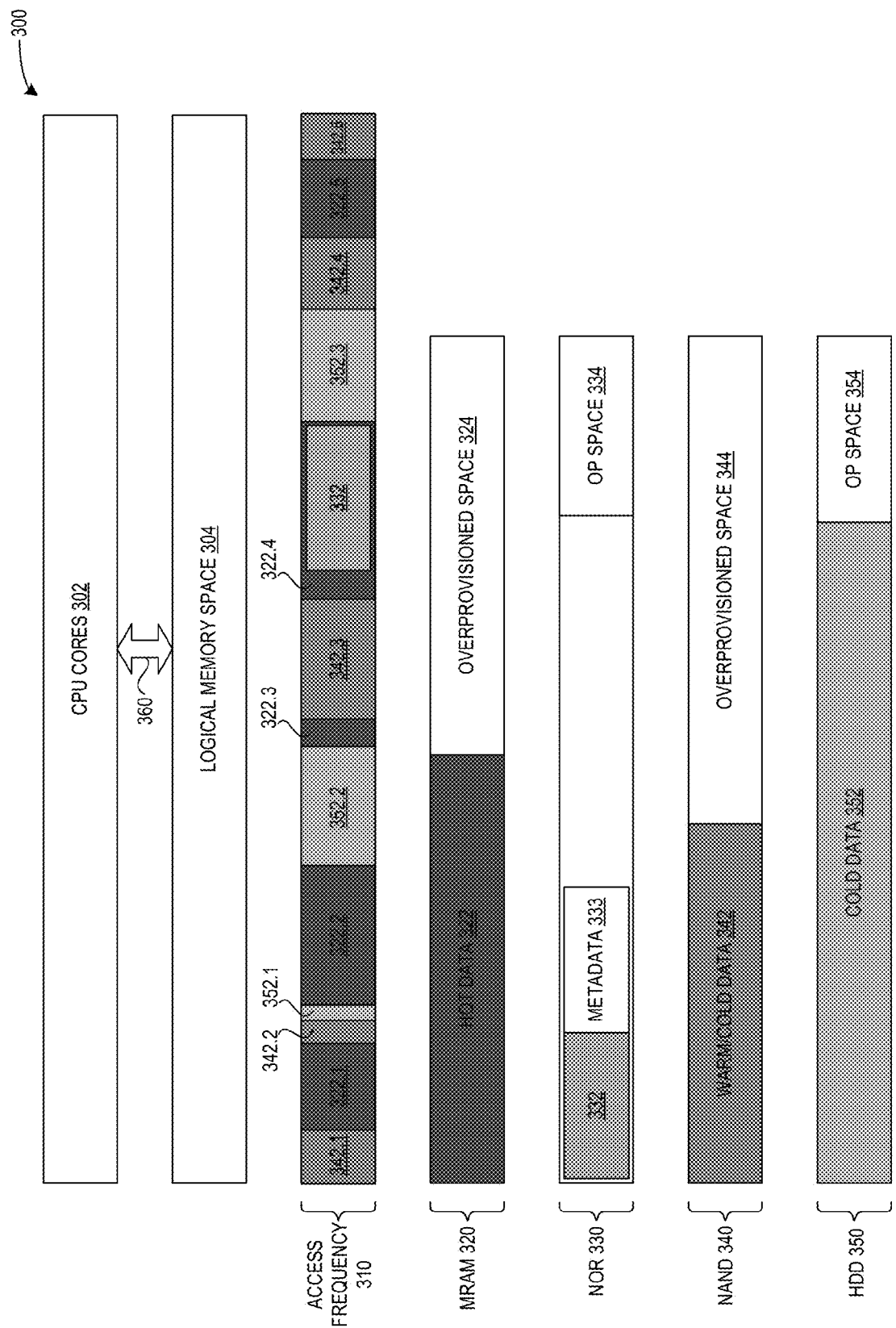
FIG. 3 illustrates an exemplary organization of a non-volatile storage system which includes an MRAM, a NOR memory, a NAND memory, and an HDD, including data classified and organized based on access frequency, in accordance with an embodiment of the present application.

FIG. 3 illustrates an exemplary organization of a non-volatile storage system 300 which includes an MRAM, a NOR memory, a NAND memory, and an HDD, including data classified and organized based on access frequency, in accordance with an embodiment of the present application.

Storage system 300 can include: CPU cores 302, which communicate and act on a logical memory space 304 (via a communication 360). Data held in or associated with logical memory space 304 can be classified based on an access frequency or factors related to the access frequency, e.g.: whether data is accessed within a first or a second period of time; a number of times that data has been accessed in a predetermined time period or interval; and other factors based on time, a time period or interval, a periodic fixed or dynamic time interval, and whether the data has been accessed for a read or a write (update).

Access frequency 310 thus depicts a classification for data which is managed or processed by CPU cores 302 using logical memory space 304. The red color can indicate a classification of "hot" data, e.g., the hot data has been accessed within a first predetermined period of time. The orange color can indicate "high-read intensity," e.g., the data is to be read based on a predetermined access frequency, or in a predetermined range of access frequency. The green color can indicate "warm/cold" data, e.g., the cold data stored in MRAM 320 is to be copied from MRAM 320 to NAND 340 because the cold data has not been accessed within the first predetermined time period. Other classifications may be used, based on the access frequency or factors related to the access frequency.

The green colored data may be stored as "warm" data in NAND 340, and may remain in NAND 340 if it is not determined to be "cold data," e.g., the warm data stored in NAND 340 may remain or be kept in NAND 340 because the warm data has been accessed within the second predetermined time period. Subsequently, the system can evaluate or classify the "warm" data in NAND 340 as "cold" data. The blue color can indicate "cold" data, e.g., the cold data stored in NAND 340 is to be copied from NAND 340 to HDD 350 because the cold data has not been accessed within the second predetermined time period.

Access frequency 310 indicates various amounts of data, which can be evaluated based on access frequency and classified to a category which corresponds to the above-described colors: hot (red); high-intensity read-only (orange); warm (green); and cold (blue). Other classifications and categories may also be used. During operation, the system can receive data to be written to the non-volatile storage system. The system can evaluate the "hotness" of the data based on access frequency, as described here.

For example, the system can write (red) hot data 322 to MRAM 320, which can include an overprovisioned space 324. The hot data may be depicted in access frequency 310 as 322.1, 322.2, 322.3, 322.4, and 322.5. The system can write high-intensity read-only data 332 to NOR 330 along with metadata 333. NOR 330 can include an overprovisioned (OP) space 334. The system can also determine that certain data in MRAM 320 has not been accessed within a first predetermined time period, and can write that data as (green) warm data 342 to NAND 340, which can include an overprovisioned space 344. The warm data can be depicted in access frequency 310 as 342.1, 342.2, 342.3, 342.4, and 342.5. The system can further determine that warm data stored in NAND 340 has not been accessed within a second predetermined time period, and can write that data as (blue) cold data 352 to HDD 350. HDD 350 can also include an overprovisioned (OP) space 354. The cold data can be depicted in access frequency 310 as 352.1, 352.2, and 352.3.

Note that the amount of data moved between MRAM 320, NAND 340, and HDD 350 may not appear to be the same as the amount of data managed in logical memory space 304 and indicated by access frequency 310; the depicted amounts of data are for illustrative purposes only.

Thus, in the embodiments described herein, the system can organize and manage the entire memory space, which is the sum of the capacity of the various non-volatile storage media or devices (i.e., MRAM 320, NOR 330, NAND 340, and HDD 350), without relying on DRAM. The system can initially place data in MRAM 320, and can evaluate all data held in MRAM 320 or NAND 340 for "hotness," i.e., based on access frequency. The system can subsequently move data between the various non-volatile storage media or devices based on the determined access frequency of the data (which can be based on predetermined time periods, etc.). This data organization and movement can increase the overall size of the entire memory space, and can address the trilemma of data retention, media endurance, and bandwidth, as described below in relation to FIGS. 4A and 4B.

Breaking the Trilemma Between Retention, Endurance, and Bandwidth

Figures 4A, 4B:
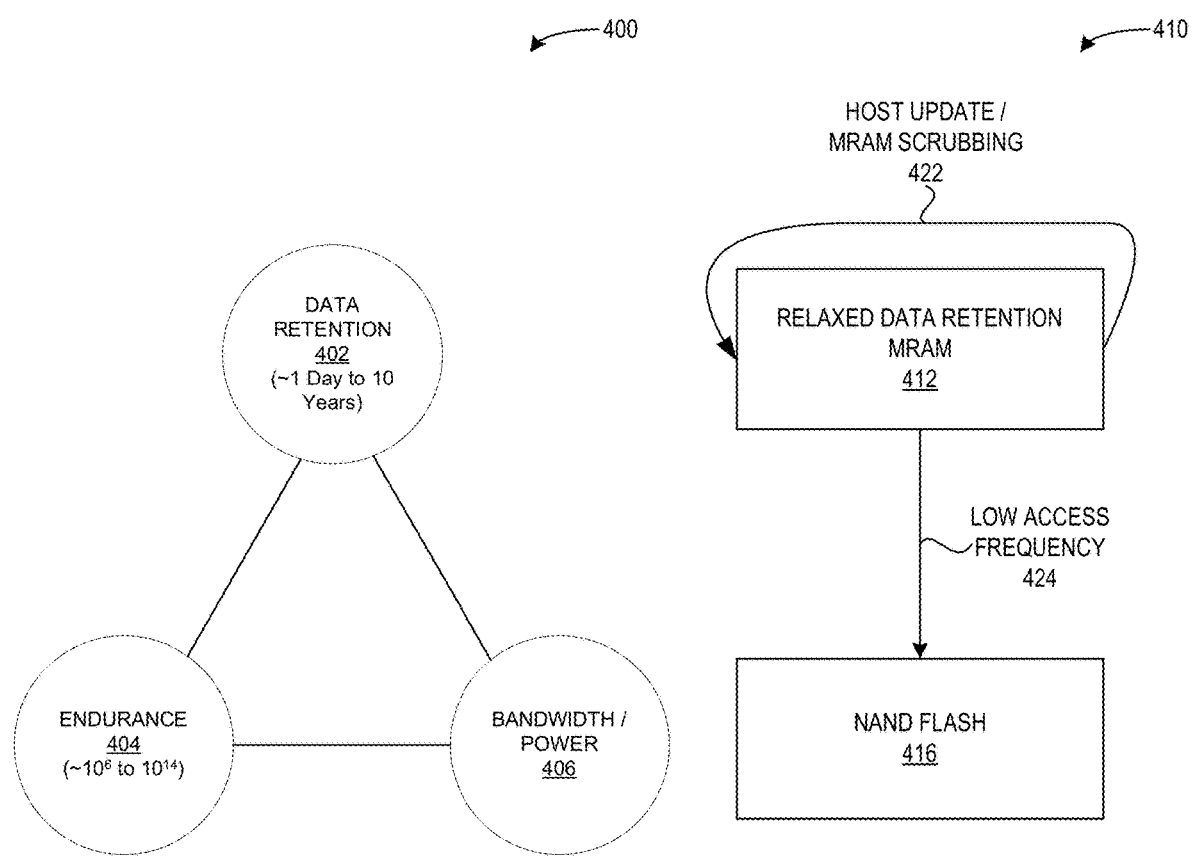
FIG. 4A illustrates a diagram of the trilemma between data retention, endurance, and bandwidth, in accordance with an embodiment of the present application.
FIG. 4B illustrates an example of breaking the trilemma of FIG. 4A, in accordance with an embodiment of the present application.

FIG. 4A illustrates a diagram of the trilemma 400 between data retention 402, endurance 404, and bandwidth 406, in accordance with an embodiment of the present application. As described above, the high-performance processing required and performed by current applications can involve moving large amount of data between processors, memory, and storage drives, which can limit, e.g., performance, cost, power consumption, bandwidth, data retention, and endurance. Furthermore, data storage generally requires persistence with low latency. While MRAM may provide this low latency, MRAM may continue to face the trilemma of balancing data retention, endurance, and bandwidth.

FIG. 4B illustrates an example 410 of breaking the trilemma of FIG. 4A, in accordance with an embodiment of the present application. In example 410, the described embodiment uses NAND flash to mitigate the data retention issue of MRAM. By using a relaxed data retention in MRAM 412, the system can use a frequency of access as a factor on which to base updates and data movement. For example, if a single page of data is updated frequently and rewritten to MRAM prior to a failure based on data retention (e.g., via a host update/MRAM scrubbing 422 function), the system can maintain the data in MRAM 412. If the single page of data is not updated frequently, the system can move the infrequently accessed data to a NAND flash 416 (via a low access frequency 424 function). Thus, the system can provide a more relaxed requirement on data retention for data stored in the MRAM, which can break the trilemma as depicted in FIG. 4A.

Exemplary Management of Data

Figure 5:
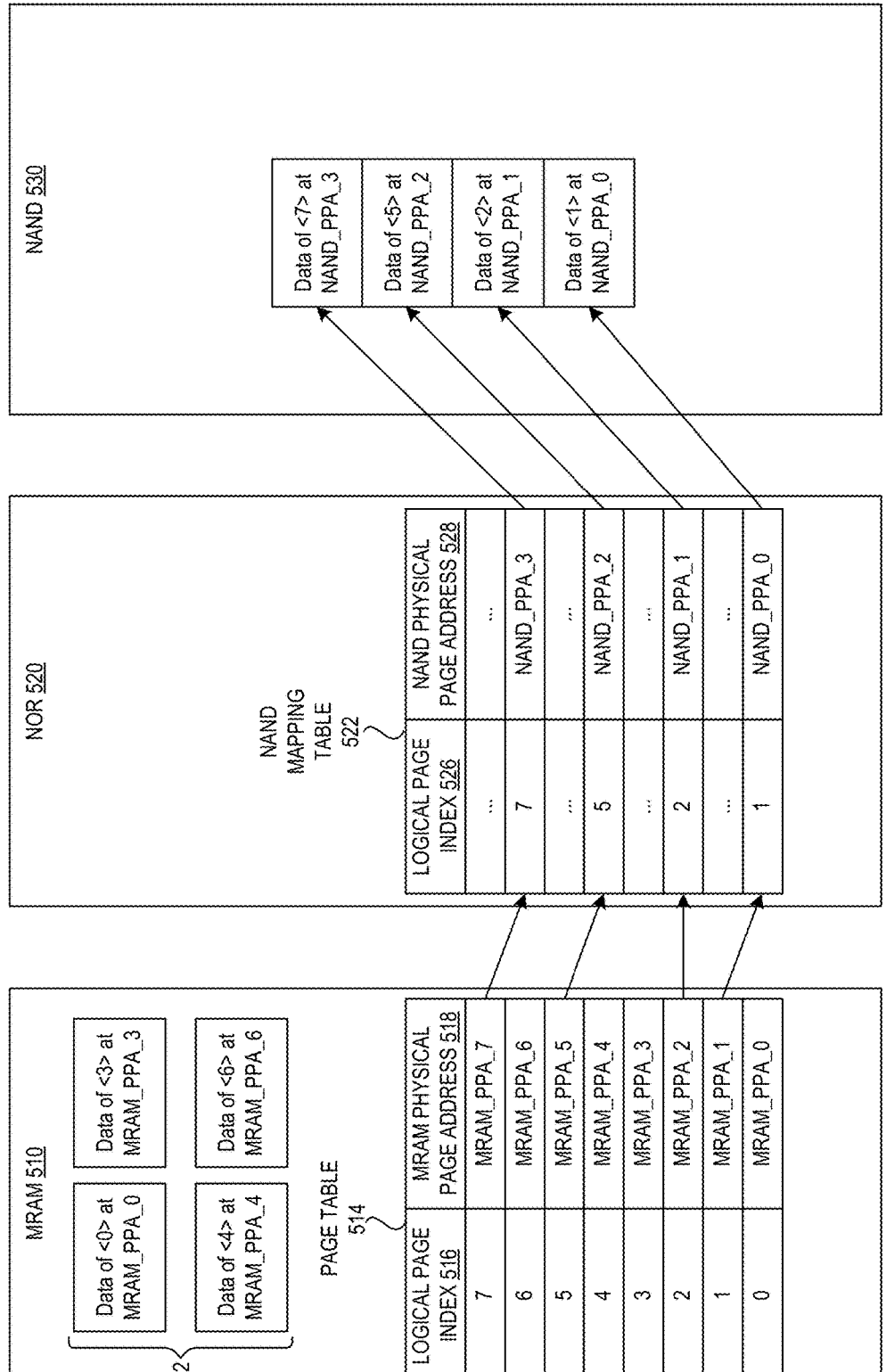
FIG. 5 depicts an exemplary management of data which facilitates data retention, including copying data from MRAM to NAND and maintaining the NAND mapping table in NOR, in accordance with an embodiment of the present application.

FIG. 5 depicts an exemplary management 500 of data which facilitates data retention, including copying data from MRAM to NAND and maintaining the NAND mapping table in NOR, in accordance with an embodiment of the present application. Management 500 can depict an environment, which can include: an MRAM 510; a NOR 520; and a NAND 530. MRAM 510 can include data stored in pages 512 and a page table 514. Page table 514 can include entries with a logical page index 516 which is mapped to an MRAM physical page address 518. Pages 512 can include data corresponding to a logical page index stored at a particular MRAM physical page address. For example, pages 512 can include: data corresponding to logical page index <0> stored at MRAM physical page address "MRAM_PPA_0"; data corresponding to logical page index <3> stored at MRAM physical page address "MRAM_PPA_3"; data corresponding to logical page index <4> stored at MRAM physical page address "MRAM_PPA_4"; and data corresponding to logical page index <6> stored at MRAM physical page address "MRAM_PPA_6." Page table 514 can include entries which map each of these logical page indices (i.e., <0>, <3>, <4>, and <6>) to the corresponding respective MRAM physical page address, along with the entries corresponding to logical page indices <1>, <2>, <5>, and <7>.

During operation, the system can determine to move certain data from MRAM 510 to NAND 530, e.g., based on an access frequency of data in the MRAM, or in response to determining that the data in the MRAM is not accessed within a first predetermined time. For example, the system can determine that the data corresponding to logical page indices <1>, <2>, <5>, and <7> as stored at, respectively, "MRAM_PPA_1", "MRAM_PPA_2" "MRAM_PPA_5", and "MRAM_PPA_7," is not accessed within a first predetermined period of time (e.g., classified as cold data). The system can copy this cold data from MRAM 510 to NAND 530, and can map, in NAND map 522 of NOR 520, the logical page index of each page of data to its respective NAND physical page address.

NAND mapping table 522 is stored in NOR 520, which can handle high-intensity read operations more efficiently than NAND 530, and can be associated with a read latency which is in a similar range as DRAM. NAND mapping table 522 can include entries which map a logical page index to the corresponding NAND physical address. For example, when mapping the data to be moved from MRAM 510 to NAND 530, the system can store in NAND mapping table 522 of NOR 520 the following entries: an entry which maps logical page index <7> to a NAND physical address of "NAND_PPA_3"; an entry which maps logical page index <5> to a NAND physical address of "NAND_PPA_2"; an entry which maps logical page index <2> to a NAND physical address of "NAND_PPA_1"; and an entry which maps logical page index <1> to a NAND physical address of "NAND_PPA_0." Thus, the data stored in NAND 530 at these NAND physical addresses corresponds to the logical page indices <1>, <2>, <5>, and <7>.

On a subsequent read, if the system experiences a page miss when attempting to access the page in MRAM, the system can retrieve, from NAND mapping table 522 of NOR 520, the NAND physical page address at which the data is stored in NAND, and thus access the data from that NAND physical page address.

Figure 6:
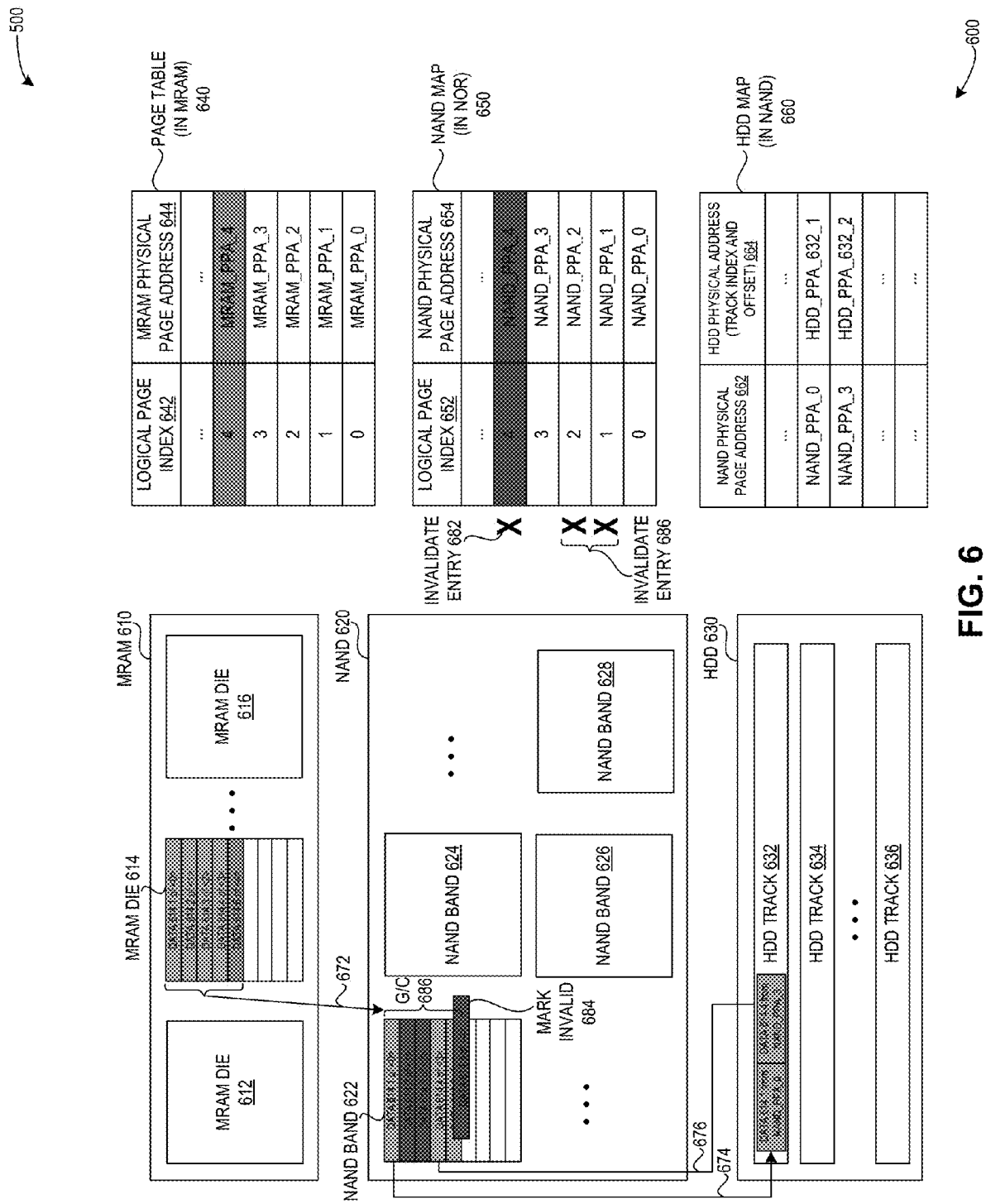
FIG. 6 depicts an exemplary environment and communications for constructing metadata and managing data in a storage system, in accordance with an embodiment of the present application.

FIG. 6 depicts an exemplary environment 600 and communications for constructing metadata and managing data in a storage system, in accordance with an embodiment of the present application. Environment 600 can include: MRAM 610, which can include a plurality of MRAM dies 612, 614, and 616, where each MRAM die can include a plurality of pages; NAND 620, which can include a plurality of NAND bands 622, 624, 626, and 628, where each NAND band can include a plurality of pages; and HDD 630, which can include a plurality of HDD tracks 632, 634, and 636, where each HDD track can store data in units such as pages.

Data stored in MRAM 610 can be managed or organized based on a page table (in MRAM) 640, where an entry in page table 640 maps a logical page index 642 to an MRAM physical page address 644 (as described above in relation to FIG. 5). Data stored in NAND 620 can be managed or organized based on a NAND map (in NOR) 650, where an entry in NAND map 650 maps a logical page index 652 to a NAND physical page address 654 (as described above in relation to FIG. 5). Data stored in HDD 630 can be managed or organized based on an HDD map (in NAND) 660, where an entry in HDD map 660 maps a NAND physical page address 662 to an HDD physical page address (e.g., a track index and offset) 664.

During operation, the system can receive a request to write data to the non-volatile storage which includes MRAM 610, NAND 620, and HDD 630. The system can allocate MRAM physical addresses for the data, e.g.: "MRAM_PPA_0" for data 614.1 corresponding to logical page index <0>; "MRAM_PPA_1" for data 614.2 corresponding to logical page index <1>; "MRAM_PPA_2" for data 614.3 corresponding to logical page index <2>; "MRAM_PPA_3" for data 614.4 corresponding to logical page index <3>; and "MRAM_PPA_4" for data 614.5 corresponding to logical page index <4>. The system can write data 614.1-614.5 to MRAM 610 at the respectively allocated MRAM physical addresses in MRAM die 614. The system can also map the logical page indices associated with the data to the allocated MRAM physical addresses, as depicted by the entries in page table 640.

The system can determine that data 614.1-614.5 in MRAM die 614 of MRAM 610 is not accessed within a first predetermined time period (indicated in brown; data 614.5 is indicated in green to depict a subsequent operation). The system can copy data 614.1-614.5 from MRAM die 614 to NAND band 622 of NAND 620 (via a communication 672). The system can map the logical indices of data 614.1-614.5 to the corresponding NAND physical page addresses in NAND map (in NOR) 650 (as shown). For example: logical page index <4> corresponding to data 614.5 can be mapped to "NAND_PPA_4"; logical page index <3> corresponding to data 614.4 can be mapped to "NAND_PPA_3"; logical page index <2> corresponding to data 614.3 can be mapped to "NAND_PPA_2"; logical page index <1> corresponding to data 614.2 can be mapped to "NAND_PPA_1"; and logical page index <0> corresponding to data 614.1 can be mapped to "NAND_PPA_0."

The system can determine that data 614.1 and 614.4 in NAND 620 are not accessed within a second predetermined time period. The system can copy data 614.1 and 614.4 from NAND band 622 of NAND 620 to HDD track 632 of HDD 630 (via communications 674 and 676). The system can map the NAND physical pages addresses of data 614.1 and 614.4 to the corresponding HDD physical addresses in HDD map (in NAND) 660 (as shown). For example, an entry with a NAND physical page address of "NAND_PPA_0" (corresponding to data 614.1) can be mapped to an HDD physical address (track index and offset) of "HDD_PPA_632_1," and an entry with a NAND physical page address of "NAND_PPA_3" (corresponding to data 614.4) can be mapped to an HDD physical address (track index and offset) of "HDD_PPA_632_2."

The system can receive a request to write an update of the data previously written to the non-volatile storage (e.g., updated data 614.5 corresponding to the logical page index of <4>). The system can write updated 614.5 to MRAM 610 at a second physical page address or at the same physical page address. The example in environment 600 depicts updated data 614.5 written to the same MRAM physical page address as the prior version (shown in green). The system can reset or increment an access counter associated with data 614.5, based on a predetermined or user-configured rule or other algorithm. The system can determine that data 614.5 has already been written to NAND 620, based on a successful search of NAND map 650 for logical page index <4>, and can invalidate the corresponding entry for logical page index <4> in NAND 620 (indicated in red, and further indicated as an invalidate entry 682 function and the bold X). The system can also mark as invalid the data stored at "NAND_PPA_4" in NAND band 622 of NAND 620 (indicated in red, as data 614.5 corresponding to logical page index <4>, and further indicated as a mark invalid 684 function).

The system can detect a condition which triggers a garbage collection operation in NAND 620. The system can identify a first NAND block to be recycled, e.g., as indicated by a garbage collection operation 686 on data 614.1-614.5 stored in NAND band 622 of NAND 620 (the five NAND pages corresponding to data 614.1 to 614.5). Data 614.1 and 614.4 have already been copied to HDD 630, and are thus already marked invalid (not depicted with an X). Data 614.5 has previously been updated in MRAM 614, and thus corresponding data 614.5 in NAND has also already been marked invalid (function 684). In this example, the system can determine that data 614.2 and 614.3 in NAND 620 are invalid (as shown by an invalidate entry function 686), because: either data 614.2 and 614.2 are not accessed within the second predetermined period of time (in which case the data has already been copied to HDD 630, as described above for data 614.1 and 614.4); or data 614.2 and 614.3 have already been marked invalid (under the same procedure as updated data 614.5). Alternatively, the system can determine that data 614.2 and 614.3 are valid, and can copy data 614.2 and 614.3 to an available space of an open block of NAND 620. The system can perform garbage collection on the block associated with data 614.1-614.5, as described in detail in relation to FIG. 8. That is, the system can copy any valid pages from the identified block to be recycled to an available NAND block, and erase the identified NAND block.

Thus, environment 600 depicts how a memory management unit (MMU) in a CPU can work with MRAM page table 640 to bridge the logical memory address with the MRAM memory address. The system can evaluate and classify data stored in MRAM 640 based on access frequency, and move "cold" data from MRAM 610 to NAND 620 as pages which are addressed by NAND map 650. This NAND map (or NAND mapping table) is stored in NOR flash memory. The low latency of the NOR flash can provide efficient access for the high-intensity reads generally associated with accessing such a mapping table. In addition, because the system does not include any specific logical storage devices, the system can evaluate and classify data stored in NAND 620 based on access frequency, and move "cold" data from NAND 620 to HDD 630 as pages which are addressed in HDD map 660. This HDD map (or HDD mapping table) is stored in NAND 620, and maintains the mapping of the NAND physical page to the HDD physical address (i.e., a physical location indicated by an HDD track and offset). The sizes of the blocks may increase from an MRAM page (in MRAM 610) to a NAND physical page (in NAND 620) to an HDD track or other identifying physical unit.

Method for Facilitating Operation of a Storage System

Figure 7A:
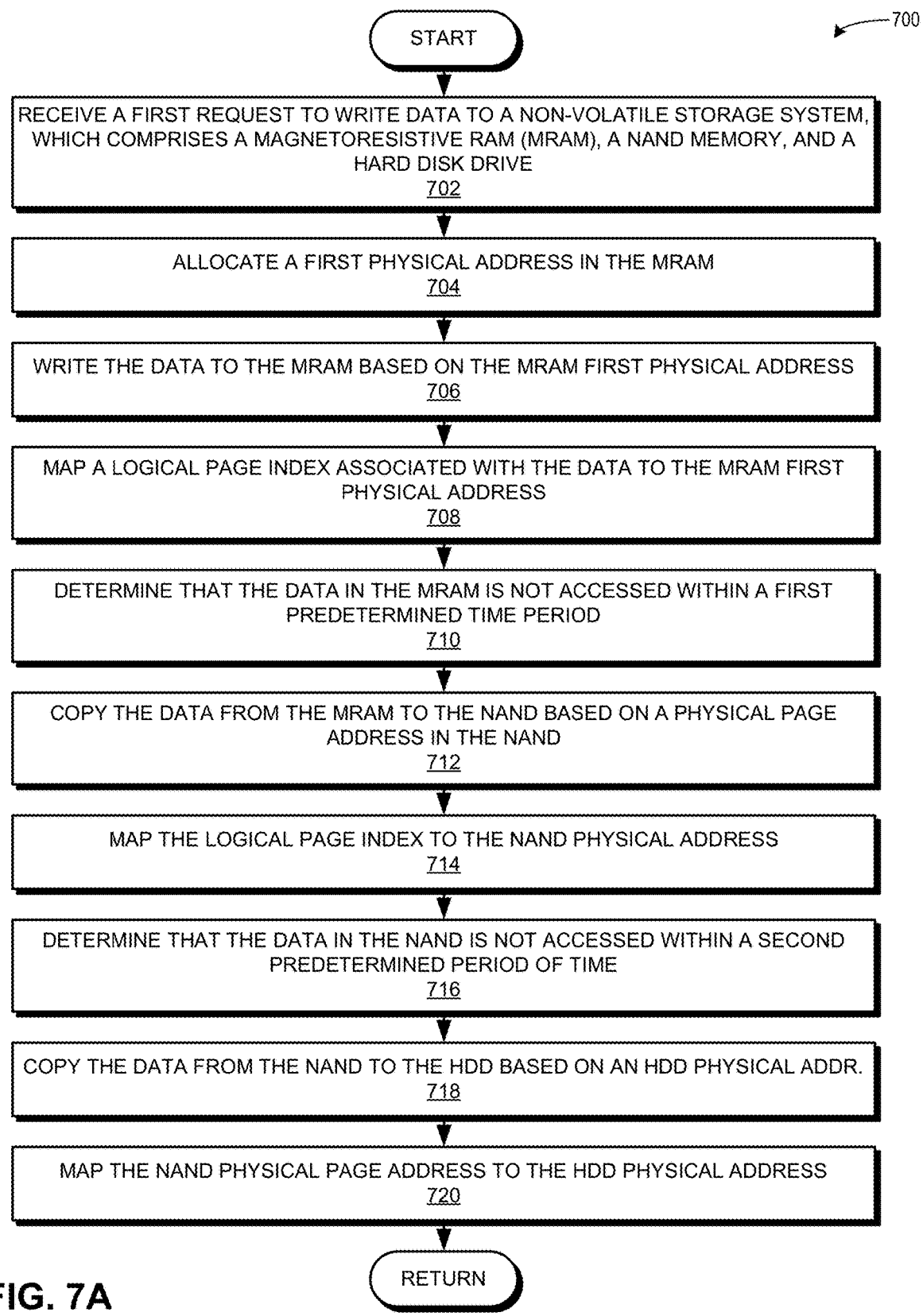
FIG. 7A presents a flowchart illustrating a method for facilitating operation of a storage system, in accordance with an embodiment of the present application.

FIG. 7A presents a flowchart 700 illustrating a method for facilitating operation of a storage system, in accordance with an embodiment of the present application. During operation, the system receives a first request to write data to a non-volatile storage system, which comprises a magnetoresistive random-access memory (MRAM), a Not-AND (NAND) memory, and a hard disk drive (HDD) (operation 702). The system allocates a first physical address in the MRAM (operation 704). The system writes the data to the MRAM based on the MRAM first physical address (operation 706). The system maps a logical page index associated with the data to the MRAM first physical address (operation 708). The system determines that the data in the MRAM is not accessed within a first predetermined time period (operation 710). The system copies the data from the MRAM to the NAND based on a physical page address in the NAND (operation 712). The system maps the logical page index to the NAND physical page address (operation 714). The system determines that the data in the NAND is not accessed within a second predetermined time period (operation 716). The system copies the data from the NAND to the HDD based on a physical address in the HDD (operation 718). The system maps the NAND physical page address to the HDD physical address (operation 720).

Figure 7B:
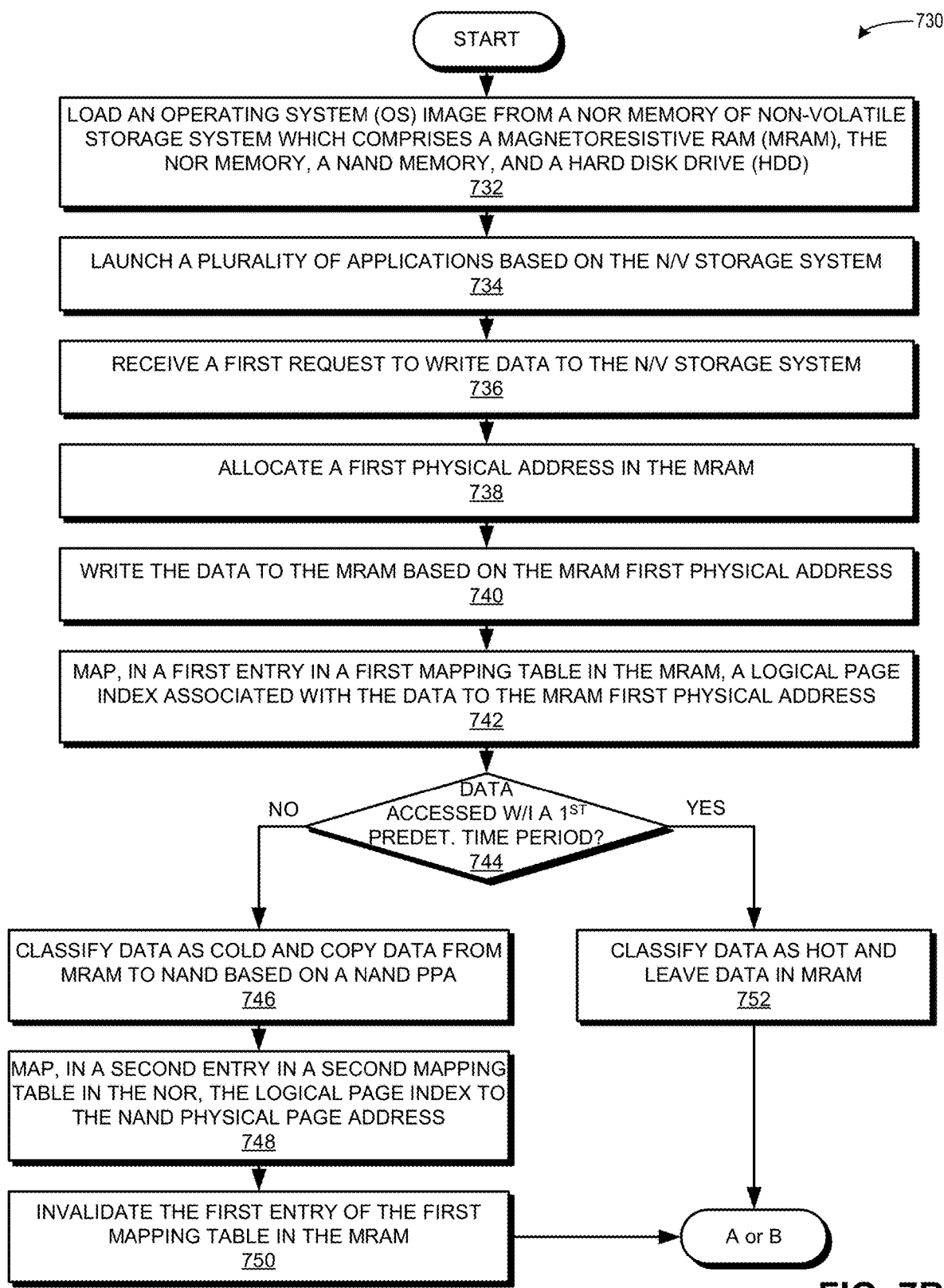
FIG. 7B presents a flowchart illustrating a method for facilitating operation of a storage system, including classifying data in MRAM and copying data to NAND, in accordance with an embodiment of the present application.

FIG. 7B presents a flowchart 730 illustrating a method for facilitating operation of a storage system, including classifying data in MRAM and copying data to NAND, in accordance with an embodiment of the present application. During operation, the system loads an operating system (OS) image from a NOR memory of a non-volatile storage system, which comprises a magnetoresistive random-access memory (MRAM), the NOR memory, a Not-AND (NAND) memory, and a hard disk drive (HDD) (operation 732). The system launches a plurality of applications based on the non-volatile storage system (operation 734). The system receives a first request to write data to the non-volatile storage system (operation 736). The system allocates a first physical address in the MRAM (operation 738, similar to operation 704). The system writes the data to the MRAM based on the MRAM first physical address (operation 740, similar to operation 706). The system maps, in a first entry in a first mapping table in the MRAM, a logical page index associated with the data to the MRAM first physical address (operation 742, similar to operation 708).

If the system determines that the data in the MRAM is not accessed within a first predetermined time period (decision 744, similar to operation 710), the system classifies the data as cold and copies the data from the MRAM to the NAND based on a physical page address in the NAND (operation 746). The system maps, in a second entry in a second mapping table in the NOR, the logical page index to the NAND physical page address (operation 748). The system invalidates the first entry of the first mapping table in the MRAM (operation 750). If the system determines that the data in the MRAM is accessed within the first predetermined time period (decision 744), the system classifies that data as hot and leaves the data in the MRAM (operation 752). The operation continues at either Label A of FIG. 7C or Label B of FIG. 7D.

Figure 7C:
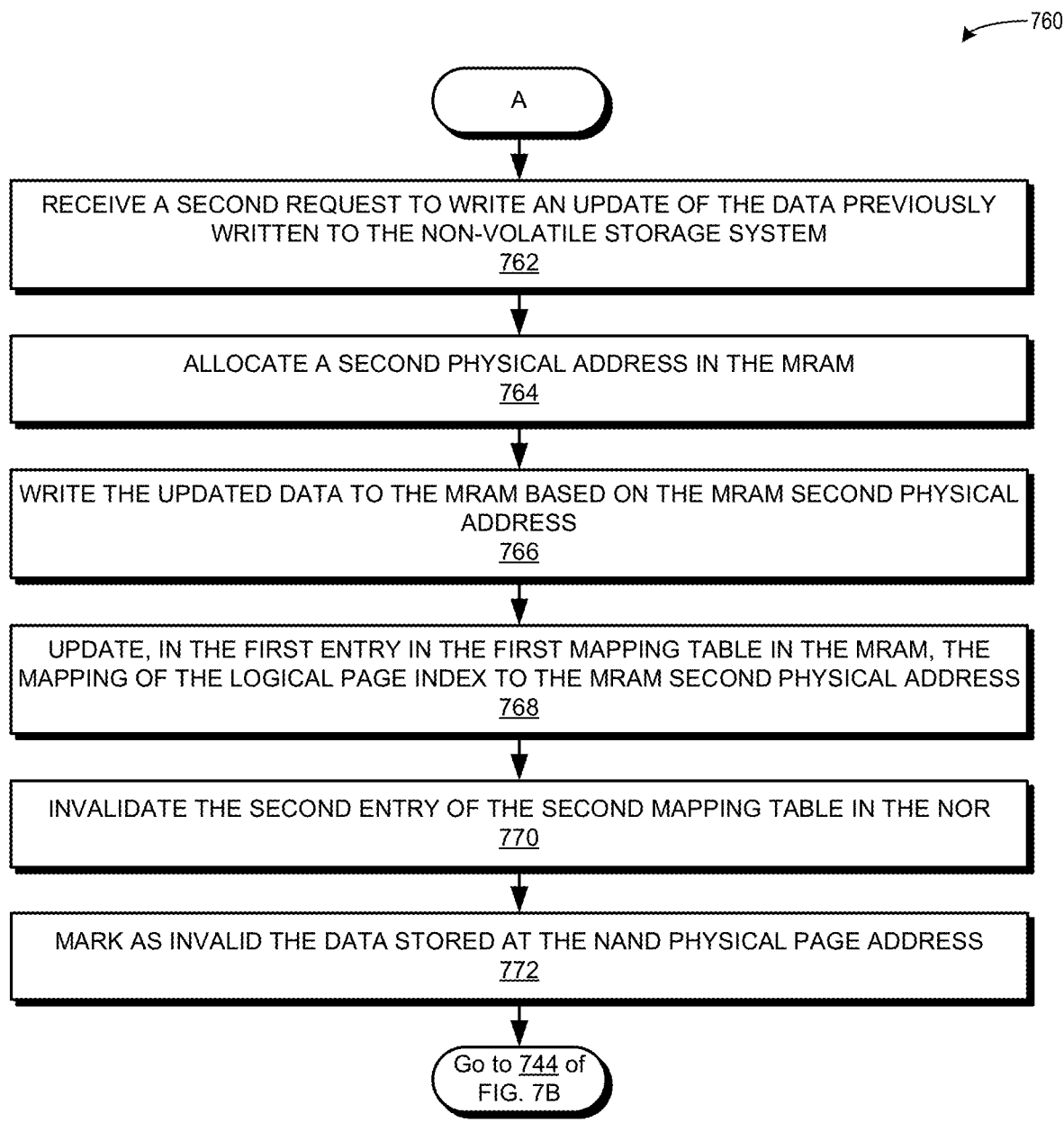
FIG. 7C presents a flowchart illustrating a method for facilitating operation of a storage system, including writing an update of previously written data, in accordance with an embodiment of the present application.

FIG. 7C presents a flowchart 760 illustrating a method for facilitating operation of a storage system, including writing an update of previously written data, in accordance with an embodiment of the present application. During operation, the system receives a second request to write an update of the data previously written to the non-volatile storage system (operation 762). The system allocates a second physical address in the MRAM (operation 764). The system can also lookup the logical address of the data in the first mapping table to obtain the corresponding MRAM physical page address, and write the updated data to the MRAM by overwriting the (existing) data at the obtained MRAM physical address (i.e., at the MRAM first physical address) (not shown). The system can write the updated data to the MRAM based on the MRAM second physical address (operation 766). The MRAM second physical address can be the same as or different than the MRAM first physical address.

If needed (i.e., if the MRAM second physical address is not the same as the MRAM first physical address), the system can update, in the first entry in the mapping table in the MRAM, the mapping of the logical page index to the MRAM second physical address (operation 768). The system can also reset or increment an access counter associated with the data (not shown). The system can also invalidate the second entry of the second mapping table in the NOR (operation 770). In some embodiments, the system can invalidate a third entry of a third mapping table in the NAND (which third entry is mapped in operation 788 of FIG. 7D). The system can mark as invalid the data stored at the NAND physical page address (operation 772). The page corresponding to the data stored at the NAND physical address is marked as invalid, which can be used in recycling the NAND page/block in a subsequent garbage collection process. Because HDD data can be overwritten, the system may not mark the data stored at the HDD physical address as invalid (see below description of copying data from the NAND to the HDD, in relation to FIG. 7D).

Figure 7D:
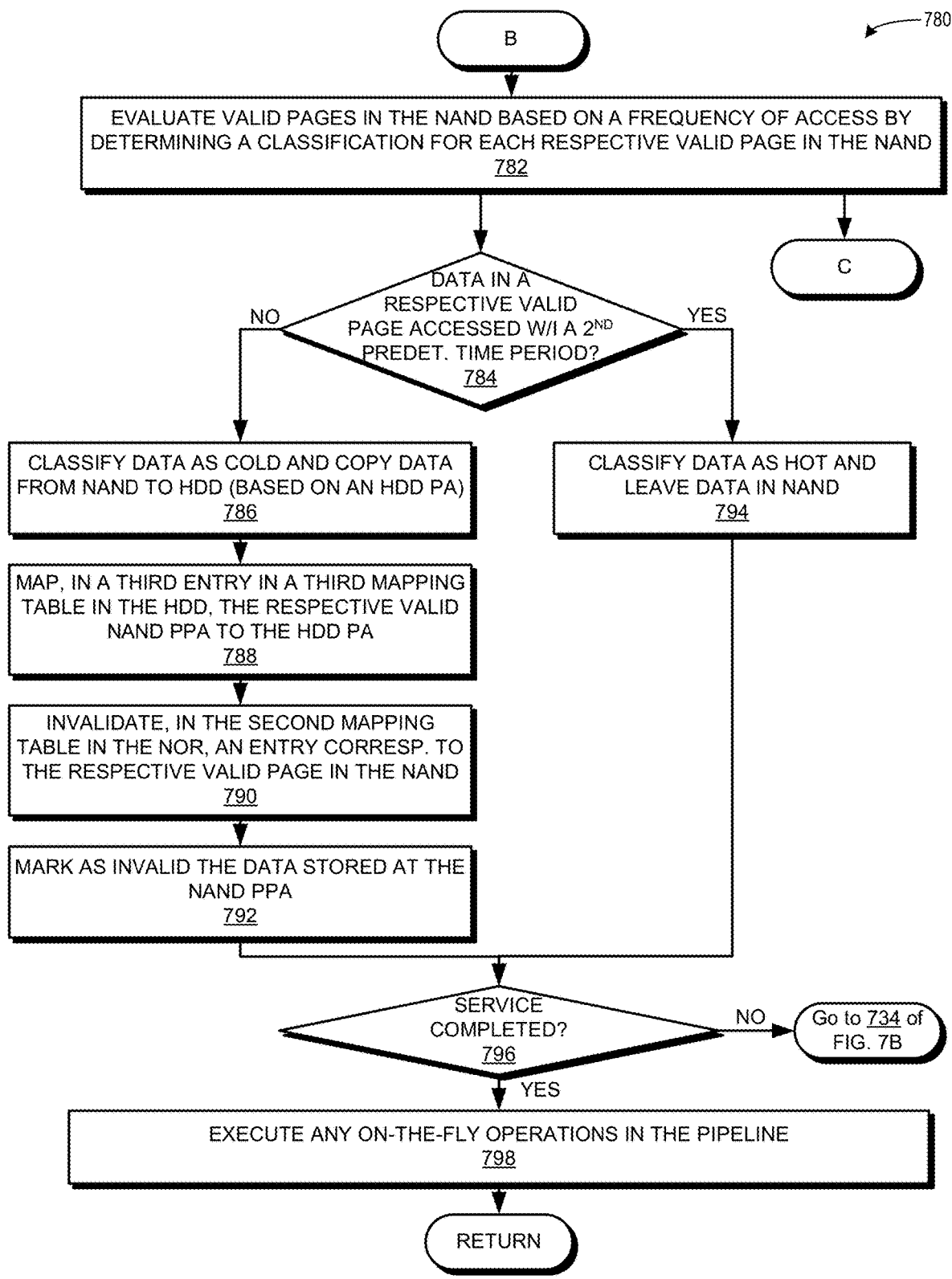
FIG. 7D presents a flowchart illustrating a method for facilitating operation of a storage system, including classifying data in NAND and copying to data to an HDD, in accordance with an embodiment of the present application.

FIG. 7D presents a flowchart 780 illustrating a method for facilitating operation of a storage system, including classifying data in NAND and copying data to an HDD, in accordance with an embodiment of the present application. During operation, the system can evaluate valid pages in the NAND based on a frequency of access by determining a classification for each respective valid page in the NAND. The system can also initially identify the valid pages. Identifying valid pages, evaluating valid pages based on access frequency, classifying valid pages, and detecting a condition which triggers garbage collection can occur at any time, and not necessarily after operation 750 or 752 (as depicted in FIG. 7B).

Figure 8:
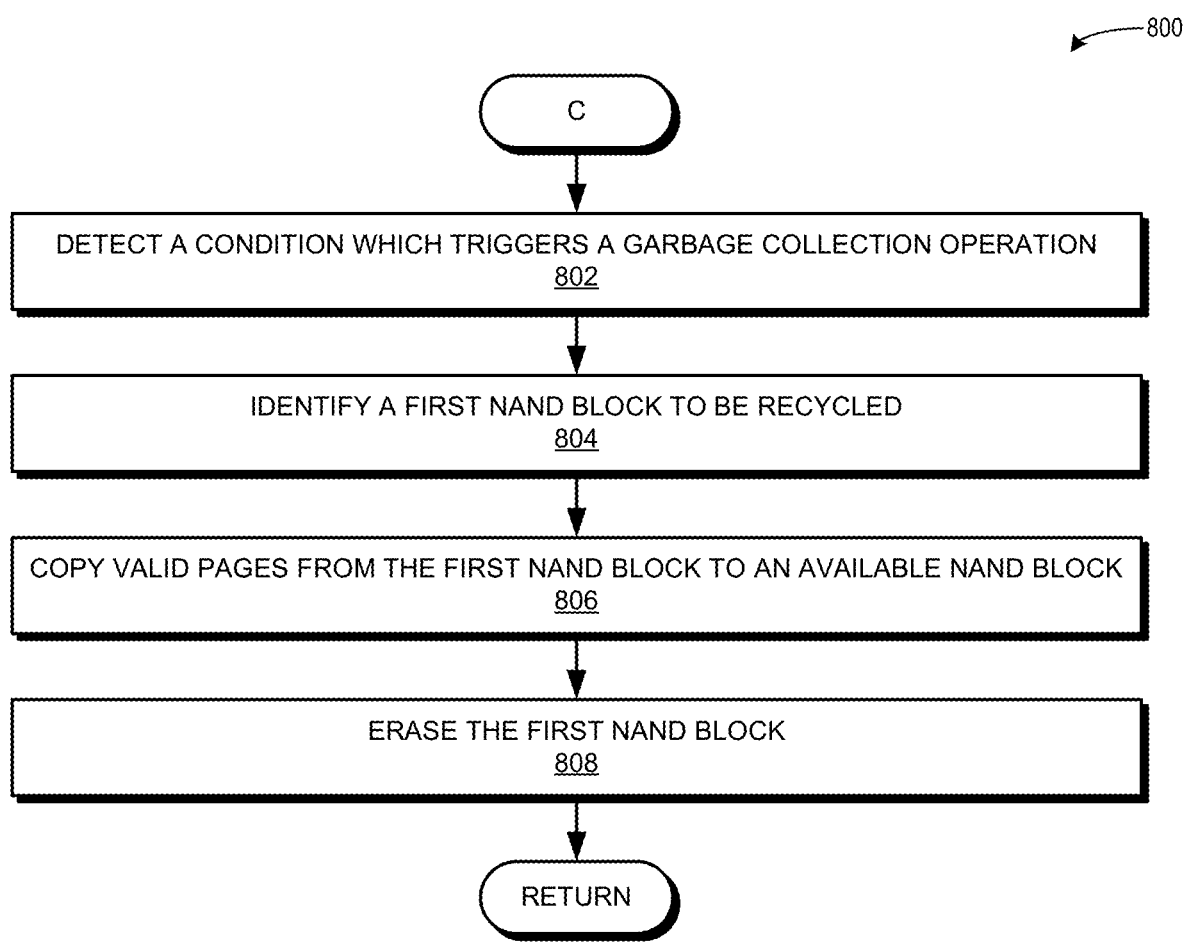
FIG. 8 presents a flowchart illustrating a method for facilitating operation of a storage system, including a garbage collection process, in accordance with an embodiment of the present application.

The operation can continue at either decision 784 or at Label C of FIG. 8 (garbage collection). If the data in a respective valid page is not accessed within a second predetermined period of time (decision 784), the system classifies the data as cold and copies the data from the NAND to the HDD (based on a physical address in the HDD) (operation 786). The system maps, in a third entry in a third mapping table in the HDD, the respective valid NAND physical page address to the HDD physical address (operation 788). The system invalidates, in the second mapping table in the NOR, an entry corresponding to the respective valid page in the NAND (operation 790). The system marks as invalid the data stored at the NAND physical page address (operation 792). If the data in a respective valid page is accessed within the second predetermined period of time (decision 784), the system classifies the data as hot and leaves the data in the NAND (operation 794).

If the service of the running applications is not completed (decision 796), the operation returns to operation 734 of FIG. 7B. If the service of the running applications is completed (decision 796), the system executes any on-the-fly operations in the pipeline (operation 798), and the operation returns.

FIG. 8 presents a flowchart 800 illustrating a method for facilitating operation of a storage system, including a garbage collection process, in accordance with an embodiment of the present application. During operation, the system detects a condition which triggers a garbage collection operation (operation 802). The system identifies a first NAND block to be recycled (operation 804). The system copies valid pages from the first NAND block to an available NAND block (operation 806). The system erases the first NAND block (operation 808).

Exemplary Computer System and Apparatus

Figure 9:
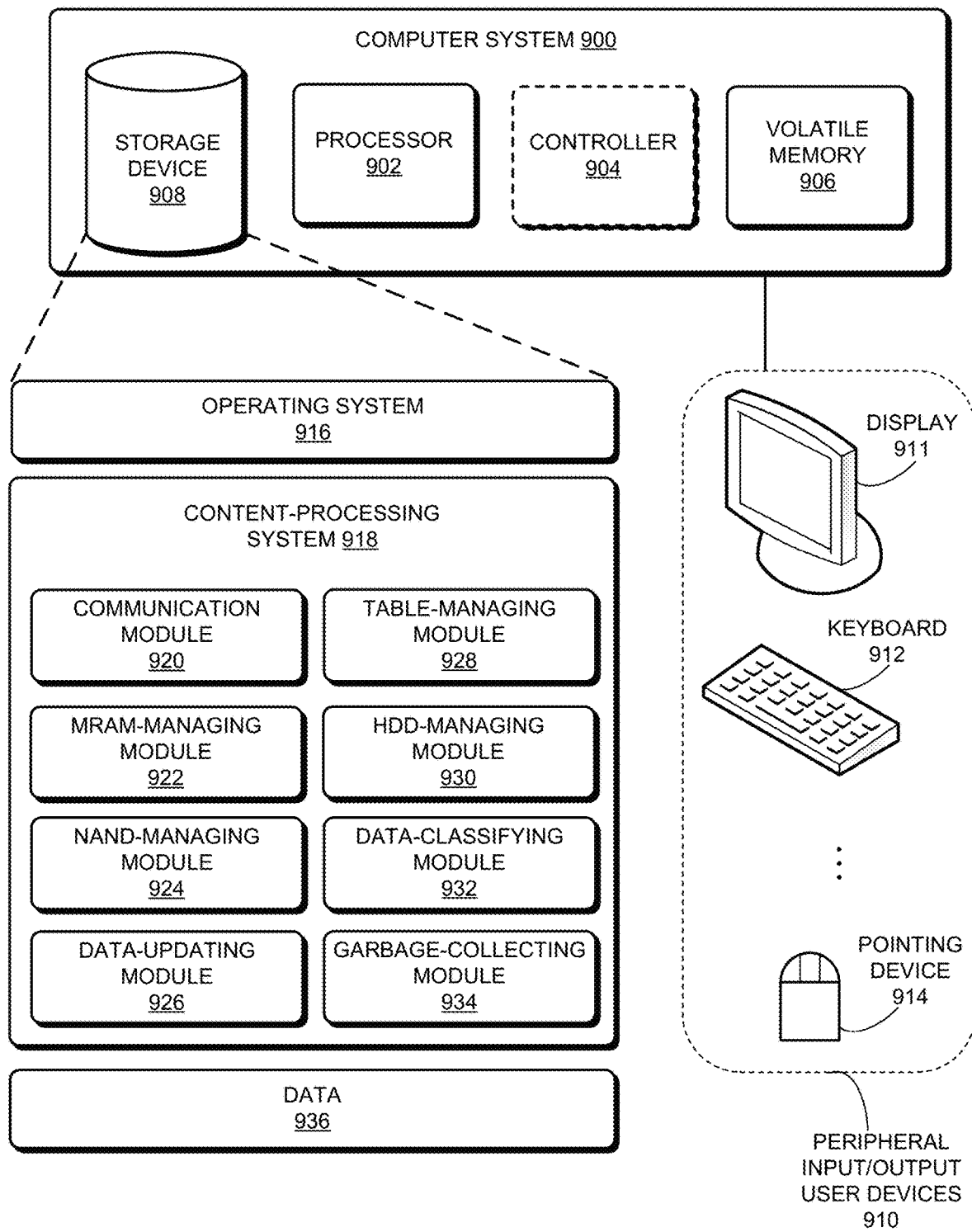
FIG. 9 illustrates an exemplary computer system that facilitates operation of a storage system, in accordance with an embodiment of the present application.

FIG. 9 illustrates an exemplary computer system 900 that facilitates operation of a storage system, in accordance with an embodiment of the present application. Computer system 900 includes a processor 902, a volatile memory 906, and a storage device 908. In some embodiments, computer system 900 can include a controller 904 (indicated by the dashed lines). Volatile memory 906 can include, e.g., random access memory (RAM), that serves as a managed memory, and can be used to store one or more memory pools. Storage device 908 can include persistent storage which can be managed or accessed via processor 902 (or controller 904). Furthermore, computer system 900 can be coupled to peripheral input/output (I/O) user devices 910, e.g., a display device 911, a keyboard 912, and a pointing device 914. Storage device 908 can store an operating system 916, a content-processing system 918, and data 936.

Content-processing system 918 can include instructions, which when executed by computer system 900, can cause computer system 900 or processor 902 to perform methods and/or processes described in this disclosure. Specifically, content-processing system 918 can include instructions for receiving and transmitting data packets, including data to be read or written and an input/output (I/O) request (e.g., a read request or a write request) (communication module 920). Content-processing system 918 can also include a memory management module or unit (not depicted), which can perform operations similar to the communications between CPU cores 302 and logical memory space 304 of FIG. 3. For example, the memory management unit can be configured to work on the logical memory space which is the cumulative memory space provided by MRAM 320, NOR 330, NAND 340, and HDD 350 of FIG. 3, e.g., by receiving read/write requests, allocating an MRAM physical address, and collaborating with the MRAM page table.

Content-processing system 918 can further include instructions for receiving a first request to write data to a non-volatile storage system, which comprises a magnetoresistive random-access memory (MRAM), a Not-AND (NAND) memory, and a hard disk drive (HDD) (communication module 920). Content-processing system 918 can further instructions for allocating a first physical address in the MRAM (MRAM-managing module 922). Content-processing system 918 can include instructions for writing the data to the MRAM based on the MRAM first physical address (MRAM-managing module 922). Content-processing system 918 can include instructions for mapping a logical page index associated with the data to the MRAM first physical address (table-managing module 928). Content-processing system 918 can also include instructions for, in response to determining that the data in the MRAM is not accessed within a first predetermined time period (data-classifying module 932): copying the data from the MRAM to the NAND based on a physical page address in the NAND (NAND-managing module 924); and mapping the logical page index to the NAND physical page address (table-managing module 928). Content-processing system 918 can include instructions for, in response to determining that the data in the NAND is not accessed within a second predetermined time period (data-classifying module 932): copying the data from the NAND to the HDD based on a physical address in the HDD (HDD-managing module 930); and mapping the NAND physical page address to the HDD physical address (table-managing module 928). Note that while table-managing module 928 is depicted as handling operations relating to multiple tables cross multiples types of non-volatile storage media, table-managing module 928 may also be distributed across components of each respective type of non-volatile storage media.

Content-processing system 918 can also include instructions for receiving a second request to write an update of the data previously written to the non-volatile storage system (communication module 920). Content-processing system 918 can include instructions for allocating a second physical address in the MRAM (MRAM-managing module 922). Content-processing system 918 can further include instructions for writing the updated data to the MRAM based on the MRAM second physical address (MRAM-managing module 922). Content-processing system 918 can include instructions for invalidating the second entry of the second mapping table in the NOR (table-managing module 928). Content-processing system 918 can include instructions for marking as invalid the data stored at the NAND physical page address (NAND-managing module 924).

Content-processing system 918 can additionally include instructions for detecting a condition which triggers a garbage collection operation (garbage-collecting module 934). Content-processing system 918 can include instructions for identifying a first NAND block to be recycled; copying valid pages from the first NAND block to an available NAND block; and erasing the first NAND block (garbage-collecting module 934).

Data 936 can include any data that is required as input or generated as output by the methods and/or processes described in this disclosure. Specifically, data 936 can store at least: data; a request; a read request; a write request; an input/output (I/O) request; data or metadata associated with a read request, a write request, or an I/O request an indicator or identifier of an MRAM, NOR, NAND, or HDD; a logical address; a logical page index; a physical address or a physical page address in an MRAM, NAND, or HDD; a track and index offset in an HDD; a first predetermined time period; a second predetermined time period; an access frequency; a counter; a classification for data based on an access frequency; a classification of hot, warm, or cold; a first mapping table which is a page table in MRAM; a second mapping table which is a NAND mapping table in NOR; a third mapping table which is an HDD mapping table in NAND; an entry in a mapping table; an entry in the first mapping table which maps a logical page index to an MRAM physical address; an entry in the second mapping table which maps a logical page index to a NAND physical address; an entry in the third mapping table which maps a NAND physical address to an HDD physical location; an invalid page or data marked as invalid in MRAM or NAND; an invalid entry in the first, second, or third mapping table; a condition which triggers a garbage collection; a block of data; an identifier of a block to be recycled; and an indicator or identifier of a plurality of applications which serve requests on the non-volatile storage system.

Figure 10:
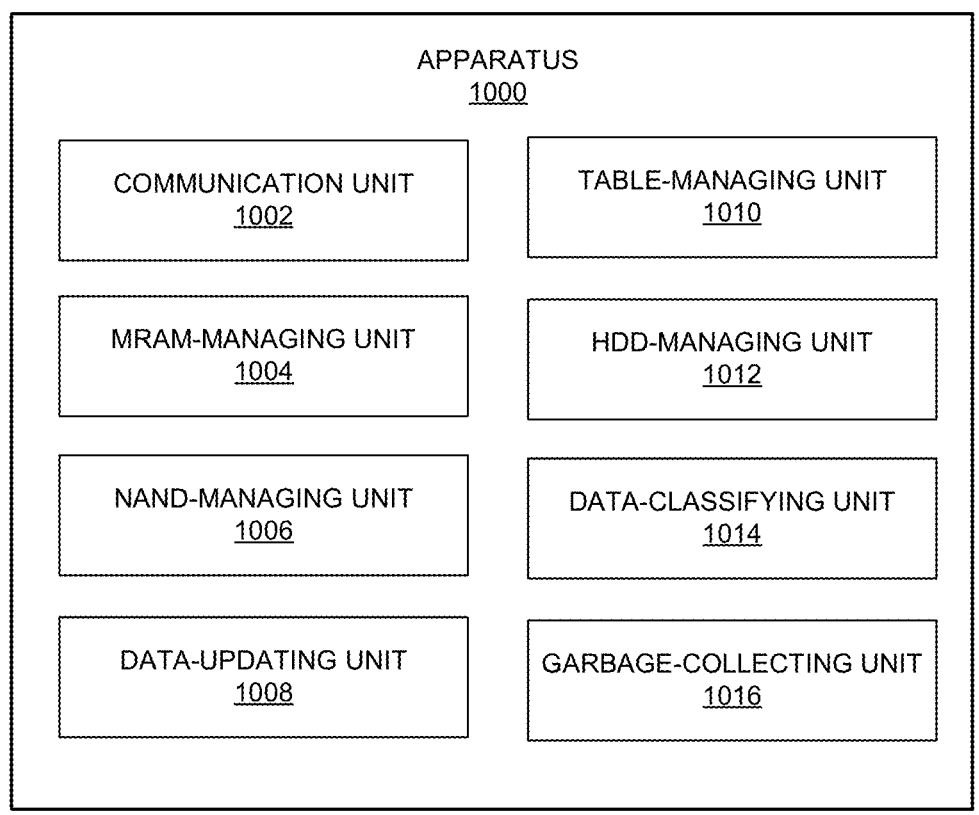
FIG. 10 illustrates an exemplary apparatus that facilitates operation of a storage system, in accordance with an embodiment of the present application.

FIG. 10 illustrates an exemplary apparatus 1000 that facilitates operation of a storage system, in accordance with an embodiment of the present application. Apparatus 1000 can comprise a plurality of units or apparatuses which may communicate with one another via a wired, wireless, quantum light, or electrical communication channel. Apparatus 1000 may be realized using one or more integrated circuits, and may include fewer or more units or apparatuses than those shown in FIG. 10. Furthermore, apparatus 1000 may be integrated in a computer system, or realized as a separate device or devices capable of communicating with other computer systems and/or devices. Apparatus 1000 can include at least one MRAM memory component, one NOR flash memory component, one NAND flash memory component, and one hard disk drive.

Apparatus 1000 may also include a non-volatile storage system which includes MRAM, NOR, NAND, and HDD. Apparatus 1000 may also include a memory management unit. Apparatus 1000 (or its associated memory management unit) can comprise modules or units 1002-1016 which are configured to perform functions or operations similar to modules 920-934 of computer system 900 of FIG. 9, including: a communication unit 1002; an MRAM-managing unit 1004; a NAND-managing unit 1006; a data-updating unit 1008; a table-managing unit 1010; an HDD-managing unit 1012; a data-classifying unit 1014; and a garbage-collecting unit 1016.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
receiving a first request to write data to a non-volatile storage system, which comprises a first non-volatile memory associated with a latency which is less than a first predetermined threshold, a Not-AND (NAND) memory, and a second non-volatile memory associated with a latency which is greater than a second predetermined threshold;
allocating a first physical address in the first non-volatile memory;
writing the data to the first non-volatile memory based on the first non-volatile memory first physical address;
mapping a logical page index associated with the data to the first non-volatile memory first physical address; and
in response to determining that the data in the first non-volatile memory is not accessed within a first predetermined time period:
copying the data from the first non-volatile memory to the NAND based on a physical page address in the NAND; and
mapping the logical page index to the NAND physical page address.

2. The method of claim 1,
wherein the first non-volatile memory comprises a magnetoresistive random-access memory (MRAM) or a resistive random-access memory (ReRAM), and
wherein the second non-volatile memory comprises a hard disk drive (HDD) or magnetic tapes.

3. The method of claim 2, further comprising:
in response to determining that the data in the NAND is not accessed within a second predetermined time period:
copying the data from the NAND to the HDD based on a physical address in the HDD; and
mapping the NAND physical page address to the HDD physical address.

4. The method of claim 2,
wherein in response to determining that the data in the MRAM is accessed within the first predetermined time period, the method further comprises:
classifying the data based on an access frequency as hot data; and
keeping the data in the MRAM; and
wherein in response to determining that the data in the NAND is accessed within a second predetermined time period, the method further comprises:
classifying the data based on an access frequency as hot data; and
keeping the data in the NAND.

5. The method of claim 2,
wherein the storage system further comprises a Not-OR (NOR) memory,
wherein the logical page index is mapped to the MRAM first physical address in a first entry of a first mapping table in the MRAM,
wherein the logical page index is mapped to the NAND physical page address in a second entry of a second mapping table in the NOR, and wherein the NAND physical page address is mapped to the HDD physical address in a third entry of a third mapping table in the NAND.

6. The method of claim 5, wherein in response to determining that the data in the MRAM is not accessed within the first predetermined time period, the method further comprises:
classifying the data based on an access frequency as cold data; and
invalidating the first entry of the first mapping table in the MRAM.

7. The method of claim 5, further comprising:
receiving a second request to write an update of the data previously written to the non-volatile storage system;
allocating a second physical address in the MRAM;
writing the updated data to the MRAM based on the MRAM second physical address;
updating, in the first entry of the first mapping table in the MRAM, the mapping of the logical page index to the MRAM second physical address;
invalidating the second entry of the second mapping table in the NOR; and
marking as invalid the data stored at the NAND physical page address.

8. The method of claim 7, further comprising:
determining, based on the first mapping table, that the updated data of the second request corresponds to data previously written to the MRAM; and
determining, based on the second mapping table, that the data previously written to the MRAM has been copied to the NAND,
wherein the allocated second physical address in the MRAM is the same as the allocated first physical address in the MRAM, and
wherein writing the updated data to the MRAM based on the MRAM second physical address causes an in-place overwrite at the MRAM first physical address.

9. The method of claim 5, further comprising:
identifying valid pages in the NAND; and
evaluating the valid pages in the NAND based on a frequency of access by determining a classification for each respective valid page in the NAND.

10. The method of claim 9, wherein in response to determining that the data in a respective valid page in the NAND is not accessed within a second predetermined time period, the method further comprises:
classifying the data based on an access frequency as cold data;
determining a new physical address in the HDD to which to copy the data;
copying the cold data from the NAND to the HDD based on the HDD new physical address;
mapping, in a fourth entry of the third mapping table, a respective physical page address of the respective valid NAND page to the HDD new physical address;
invalidating, in the second mapping table in the NOR, an entry corresponding to the respective valid page in the NAND; and
marking as invalid the data stored at the respective physical page address.

11. The method of claim 9, further comprising:
detecting a condition which triggers a garbage collection operation;
identifying a first NAND block to be recycled;
copying valid pages from the first NAND block to an available NAND block; and
erasing the first NAND block.

12. The method of claim 2, further comprising:
loading an operating system (OS) image from the NOR; and
launching a plurality of applications based on the non-volatile storage system,
wherein the first physical address in the MRAM is allocated by a memory management unit associated with the non-volatile storage system, and
wherein the memory management unit is configured to execute read/write requests by operating a cumulative physical space associated which the non-volatile storage system without requiring any logical storage drives or DRAM and without visibility into the NAND or the HDD, and
wherein the cumulative physical space does not include any overprovisioned space associated with the MRAM, the NAND, or the HDD.

13. A computer system, comprising:
a processor; and
a memory coupled to the processor and storing instructions which, when executed by the processor, cause the processor to perform a method, the method comprising:
receiving a first request to write data to a non-volatile storage system, which comprises a first non-volatile memory associated with a latency which is less than a first predetermined threshold, a Not-AND (NAND) memory, and second non-volatile memory which is associated with a latency which is greater than a second predetermined threshold;
allocating a first physical address in the first non-volatile memory;
writing the data to the first non-volatile memory based on the first non-volatile memory first physical address;
mapping a logical page index associated with the data to the first non-volatile memory first physical address; and
in response to determining that the data in the first non-volatile memory is not accessed within a first predetermined time period:
copying the data from the first non-volatile memory to the NAND based on a physical page address in the NAND; and
mapping the logical page index to the NAND physical page address.

14. The computer system of claim 13,
wherein the first non-volatile memory comprises a magnetoresistive random-access memory (MRAM) or a resistive random-access memory (ReRAM), and
wherein the second non-volatile memory comprises a hard disk drive (HDD) or magnetic tapes.

15. The computer system of claim 14, wherein the method further comprises:
in response to determining that the data in the NAND is not accessed within a second predetermined time period:
copying the data from the NAND to the HDD based on a physical address in the HDD; and
mapping the NAND physical page address to the HDD physical address.

16. The computer system of claim 14,
wherein in response to determining that the data in the MRAM is accessed within the first predetermined time period, the method further comprises:
classifying the data based on an access frequency as hot data; and
keeping the data in the MRAM; and wherein in response to determining that the data in the NAND is accessed within a second predetermined time period, the method further comprises:
  classifying the data based on an access frequency as hot data; and
  keeping the data in the NAND.

17. The computer system of claim 14,
wherein the storage system further comprises a Not-OR (NOR) memory,
wherein the logical page index is mapped to the MRAM first physical address in a first entry of a first mapping table in the MRAM,
wherein the logical page index is mapped to the NAND physical page address in a second entry of a second mapping table in the NOR, and
wherein the NAND physical page address is mapped to the HDD physical address in a third entry of a third mapping table in the NAND.

18. The computer system of claim 17, wherein in response to determining that the data in the MRAM is not accessed within the first predetermined time period, the method further comprises:
  classifying the data based on an access frequency as cold data; and
  invalidating the first entry of the first mapping table in the MRAM.

19. The computer system of claim 17, wherein the method further comprises:
  receiving a second request to write an update of the data previously written to the non-volatile storage system;
  allocating a second physical address in the MRAM;
  writing the updated data to the MRAM based on the MRAM second physical address;
  updating, in the first entry of the first mapping table in the MRAM, the mapping of the logical page index to the MRAM second physical address;
  invalidating the second entry of the second mapping table in the NOR; and
  marking as invalid the data stored at the NAND physical page address.

20. The computer system of claim 19, wherein the method further comprises:
  determining, based on the first mapping table, that the updated data of the second request corresponds to data previously written to the MRAM; and
  determining, based on the second mapping table, that the data previously written to the MRAM has been copied to the NAND,
  wherein the allocated second physical address in the MRAM is the same as the allocated first physical address in the MRAM, and
  wherein writing the updated data to the MRAM based on the MRAM second physical address causes an in-place overwrite at the MRAM first physical address.

21. The computer system of claim 17, wherein the method further comprises:
  identifying valid pages in the NAND; and
  evaluating the valid pages in the NAND based on a frequency of access by determining a classification for each respective valid page in the NAND.

22. The computer system of claim 21, wherein in response to determining that the data in a respective valid page in the NAND is not accessed within the second predetermined time period, the method further comprises:
  classifying the data based on an access frequency as cold data;
  determining a new physical address in the HDD to which to copy the data;
  copying the cold data from the NAND to the HDD based on the HDD new physical address;
  mapping, in a fourth entry of the third mapping table, a respective physical page address of the respective valid NAND page to the HDD new physical address;
  invalidating, in the second mapping table in the NOR, an entry corresponding to the respective valid page in the NAND; and
  marking as invalid the data stored at the respective physical page address.

23. The computer system of claim 21, wherein the method further comprises:
  detecting a condition which triggers a garbage collection operation;
  identifying a first NAND block to be recycled;
  copying valid pages from the first NAND block to an available NAND block; and
  erasing the first NAND block.

24. An apparatus, comprising:
  a non-volatile storage system, which comprises a magnetoresistive random-access memory (MRAM), a Not-AND (NAND) memory, and a hard disk drive (HDD);
  a memory management unit associated with the non-volatile storage system and configured to receive a first request to write data to the non-volatile storage system and allocate a first physical address in the MRAM;
  a table-managing unit configured to map a logical page index associated with the data to the MRAM first physical address;
  an MRAM-managing unit configured to write the data to the MRAM based on the MRAM first physical address;
  a NAND-managing unit configured to, in response to determining by the MRAM-managing unit that the data in the MRAM is not accessed within a first predetermined time period, copy the data from the MRAM to the NAND based on a physical page address in the NAND,
    wherein the table-managing unit is further configured to map the logical page index to the NAND physical page address; and
  an HDD-managing unit configured to, in response to determining by the NAND-managing unit that the data in the NAND is not accessed within a second predetermined time period, copy the data from the NAND to the HDD based on a physical address in the HDD,
    wherein the table-managing unit is further configured to map the NAND physical page address to the HDD physical address.

* * * * *